(12) United States Patent
Slepchenkov

(10) Patent No.: US 11,881,761 B2
(45) Date of Patent: Jan. 23, 2024

(54) MULTI-LEVEL HYSTERESIS VOLTAGE CONTROLLERS FOR VOLTAGE MODULATORS AND METHODS FOR CONTROL THEREOF

(71) Applicant: TAE Technologies, Inc., Foothill Ranch, CA (US)

(72) Inventor: Mikhail Slepchenkov, Lake Forest, CA (US)

(73) Assignee: TAE Technologies, Inc., Foothill Ranch (CA)

( * ) Notice: Subject to any disclaimer, the term of this patent is extended or adjusted under 35 U.S.C. 154(b) by 0 days.

(21) Appl. No.: 18/297,706

(22) Filed: Apr. 10, 2023

(65) Prior Publication Data

US 2023/0396151 A1 Dec. 7, 2023

Related U.S. Application Data

(63) Continuation of application No. 17/409,295, filed on Aug. 23, 2021, now Pat. No. 11,626,791, which is a
(Continued)

(51) Int. Cl.
*H02M 1/12* (2006.01)
*H02M 3/156* (2006.01)
(Continued)

(52) U.S. Cl.
CPC ............ *H02M 1/12* (2013.01); *H02M 3/156* (2013.01); *H03K 17/567* (2013.01); *H02M 1/0048* (2021.05)

(58) Field of Classification Search
CPC .................................................... H02M 1/12
(Continued)

(56) References Cited

U.S. PATENT DOCUMENTS

| 5,204,548 A | 4/1993 | Daehler et al. |
| 5,428,522 A | 6/1995 | Millner et al. |
| (Continued) | | |

FOREIGN PATENT DOCUMENTS

| CA | 2810369 | 3/2012 |
| CN | 201789411 | 4/2011 |
| (Continued) | | |

OTHER PUBLICATIONS

De Simone, "Modular Multilevel Converter with Integrated Storage System for Automotive Applications," Dissertation for the degree of Doctor of Electrical Engineering, Politecnico di Milano, Department of Electronics, Information and Bioengineering, Sep. 21, 2021, 181 pages.
(Continued)

*Primary Examiner* — Tomi Skibinski
(74) *Attorney, Agent, or Firm* — Fish & Richardson P.C.

(57) ABSTRACT

Systems and methods that facilitate multilevel hysteresis voltage control methods for cascaded multilevel voltage modulators having a plurality of power cells connected in series and has any positive integer number of output voltage levels to control any unipolar voltage on the load of the voltage modulator, and transfer electrical power from an electrical grid via AC/DC converters or directly from energy storage elements of the power cells to that load. A method of operational rotation of the power cells of a multilevel voltage modulator, which ensures an equal power sharing among the power cells and voltage balancing of the energy storage elements of the power cells of the modulator.

13 Claims, 12 Drawing Sheets

Related U.S. Application Data continuation of application No. 16/704,797, filed on Dec. 5, 2019, now Pat. No. 11,133,739, which is a continuation of application No. PCT/US2018/038089, filed on Jun. 18, 2018.

(60) Provisional application No. 62/521,227, filed on Jun. 16, 2017.

(51) Int. Cl.
  *H03K 17/567* (2006.01)
  *H02M 1/00* (2006.01)

(58) Field of Classification Search
  USPC .................................................. 327/108
  See application file for complete search history.

(56) References Cited

U.S. PATENT DOCUMENTS

| | | |
|---|---|---|
| 5,642,275 A | 6/1997 | Peng et al. |
| 5,905,371 A | 5/1999 | Limpaecher |
| 5,933,339 A | 8/1999 | Duba et al. |
| 5,949,664 A | 9/1999 | Bernet et al. |
| 6,051,961 A | 4/2000 | Jang et al. |
| 6,058,032 A | 5/2000 | Yamanaka et al. |
| 6,064,180 A | 5/2000 | Sullivan et al. |
| 6,236,580 B1 | 5/2001 | Aiello et al. |
| 6,373,734 B1 | 4/2002 | Martinelli |
| 7,091,701 B2 | 8/2006 | Turner et al. |
| 7,485,987 B2 | 2/2009 | Mori et al. |
| 8,395,280 B2 | 3/2013 | Graovac et al. |
| 8,476,888 B1 | 7/2013 | Chen et al. |
| 8,503,202 B2 | 8/2013 | Chimento et al. |
| 8,614,525 B2 | 12/2013 | Teichmann et al. |
| 8,829,723 B2 | 9/2014 | Graovac et al. |
| 9,172,254 B2 | 10/2015 | Ganor |
| 9,444,275 B2 | 9/2016 | Huang et al. |
| 9,461,474 B2 | 10/2016 | Deboy et al. |
| 9,673,732 B2 | 6/2017 | Deboy et al. |
| 10,014,611 B2 | 7/2018 | Götz |
| 10,074,995 B2 | 9/2018 | Smedley et al. |
| 10,193,359 B2 | 1/2019 | Ganor |
| 10,218,189 B2 | 2/2019 | Goetz |
| 10,291,037 B2 | 5/2019 | Birkl et al. |
| 10,391,870 B2 | 8/2019 | Götz et al. |
| 10,396,682 B2 | 8/2019 | Götz et al. |
| 10,439,506 B2 | 10/2019 | Götz |
| 10,442,309 B2 | 10/2019 | Götz |
| 10,454,331 B2 | 10/2019 | Götz |
| 10,473,728 B2 | 11/2019 | Goetz |
| 10,630,201 B2 | 4/2020 | Götz et al. |
| 10,700,587 B2 | 6/2020 | Götz |
| 10,759,284 B2 | 9/2020 | Jaensch et al. |
| 10,784,698 B2 | 9/2020 | Jaensch et al. |
| 10,840,714 B2 | 11/2020 | Götz et al. |
| 10,980,103 B2 | 4/2021 | Götz et al. |
| 10,985,551 B2 | 4/2021 | Götz |
| 10,998,739 B2 | 5/2021 | Hinterberger et al. |
| 11,038,435 B2 | 6/2021 | Götz |
| 11,133,739 B2 | 9/2021 | Slepchenkov |
| 2003/0102845 A1 | 6/2003 | Aker et al. |
| 2004/0008016 A1 | 1/2004 | Sutardja et al. |
| 2004/0037101 A1 | 2/2004 | Meynard et al. |
| 2005/0065684 A1 | 3/2005 | Larson et al. |
| 2006/0097782 A1 | 5/2006 | Ebner |
| 2006/0202636 A1 | 9/2006 | Schneider |
| 2007/0147098 A1 | 6/2007 | Mori et al. |
| 2007/0194627 A1 | 8/2007 | Mori et al. |
| 2007/0246635 A1 | 10/2007 | Nakajima et al. |
| 2008/0080212 A1 | 4/2008 | Grbovic |
| 2008/0245593 A1 | 10/2008 | Kim |
| 2008/0304296 A1 | 12/2008 | Nadimpalliraju et al. |
| 2009/0251212 A1 | 10/2009 | Pillonnet et al. |
| 2009/0311891 A1 | 12/2009 | Lawrence et al. |
| 2010/0060235 A1 | 3/2010 | Dommaschk et al. |
| 2010/0085789 A1 | 4/2010 | Ulrich et al. |
| 2010/0121511 A1 | 5/2010 | Onnerud et al. |
| 2010/0298957 A1 | 11/2010 | Sanchez Rocha et al. |
| 2010/0301827 A1 | 12/2010 | Chen et al. |
| 2011/0133573 A1 | 6/2011 | Ratnaparkhi et al. |
| 2011/0140533 A1 | 6/2011 | Zeng et al. |
| 2011/0148198 A1 | 6/2011 | Tripathi et al. |
| 2011/0187184 A1 | 8/2011 | Ichikawa |
| 2011/0198936 A1* | 8/2011 | Graovac .................. B60L 58/18 363/71 |
| 2012/0053871 A1 | 3/2012 | Sirard |
| 2012/0074949 A1 | 3/2012 | Kepley et al. |
| 2012/0112693 A1 | 5/2012 | Kusch et al. |
| 2012/0155140 A1 | 6/2012 | Chen et al. |
| 2012/0161858 A1 | 6/2012 | Permuy et al. |
| 2012/0195084 A1 | 8/2012 | Norrga |
| 2012/0262967 A1 | 10/2012 | Cuk |
| 2013/0027126 A1 | 1/2013 | Jayaraman et al. |
| 2013/0083563 A1* | 4/2013 | Wang ................. H02M 3/33507 363/17 |
| 2013/0088254 A1 | 4/2013 | Hoang et al. |
| 2013/0088903 A1 | 4/2013 | Sagona et al. |
| 2013/0090872 A1 | 4/2013 | Kurimoto |
| 2013/0154379 A1 | 6/2013 | Tiefenbach |
| 2013/0154521 A1 | 6/2013 | Butzmann et al. |
| 2013/0260188 A1 | 10/2013 | Coates |
| 2013/0285457 A1 | 10/2013 | Kepley |
| 2013/0302652 A1 | 11/2013 | Wolff et al. |
| 2013/0335043 A1 | 12/2013 | He et al. |
| 2014/0042815 A1 | 2/2014 | Maksimovic et al. |
| 2014/0042827 A1 | 2/2014 | Wolff |
| 2014/0104899 A1 | 4/2014 | Fischer et al. |
| 2014/0152109 A1 | 6/2014 | Kanakasabai et al. |
| 2014/0160818 A1 | 6/2014 | Garces et al. |
| 2014/0226379 A1 | 8/2014 | Harrison |
| 2014/0239927 A1 | 8/2014 | Nascimento et al. |
| 2014/0254219 A1 | 9/2014 | Davies |
| 2014/0340052 A1 | 11/2014 | Dwertmann et al. |
| 2014/0354212 A1 | 12/2014 | Sugeno et al. |
| 2015/0009594 A1 | 1/2015 | Okaeme et al. |
| 2015/0049532 A1 | 2/2015 | Bernet et al. |
| 2015/0124506 A1 | 5/2015 | Sahoo et al. |
| 2015/0229227 A1 | 8/2015 | Aeloiza et al. |
| 2015/0249351 A1 | 9/2015 | Wolff et al. |
| 2015/0270801 A1 | 9/2015 | Kessler et al. |
| 2015/0280604 A1 | 10/2015 | Hassanpoor |
| 2015/0288287 A1 | 10/2015 | Madawala et al. |
| 2015/0296292 A1 | 10/2015 | Hogan et al. |
| 2015/0303820 A1* | 10/2015 | Cubaines .............. H02M 5/458 363/37 |
| 2015/0340964 A1 | 11/2015 | Modeer |
| 2015/0364935 A1 | 12/2015 | Fetzer et al. |
| 2016/0072396 A1 | 3/2016 | Deboy et al. |
| 2016/0183451 A1 | 6/2016 | Conrad et al. |
| 2016/0240894 A1 | 8/2016 | Wartenberg et al. |
| 2016/0254682 A1 | 9/2016 | Yip et al. |
| 2016/0308466 A1 | 10/2016 | Oates |
| 2017/0054306 A1 | 2/2017 | Vo et al. |
| 2017/0099007 A1 | 4/2017 | Oates et al. |
| 2017/0163171 A1 | 6/2017 | Park |
| 2017/0179745 A1 | 6/2017 | Tritschler et al. |
| 2017/0338654 A1 | 11/2017 | Subramanian |
| 2017/0366079 A1 | 12/2017 | Bhowmik et al. |
| 2018/0043789 A1 | 2/2018 | Goetz |
| 2018/0175744 A1 | 6/2018 | Jasim et al. |
| 2018/0241239 A1 | 8/2018 | Frost et al. |
| 2019/0031042 A1 | 1/2019 | Müller |
| 2019/0131851 A1 | 5/2019 | Herb |
| 2019/0288522 A1 | 9/2019 | Hinterberger et al. |
| 2019/0288526 A1 | 9/2019 | Jaensch et al. |
| 2019/0288527 A1 | 9/2019 | Jaensch et al. |
| 2019/0288547 A1 | 9/2019 | Jaensch et al. |
| 2019/0288617 A1 | 9/2019 | Jaensch et al. |
| 2019/0312504 A1 | 10/2019 | Kim et al. |
| 2020/0195125 A1 | 6/2020 | Slepchenkov |
| 2020/0212687 A1 | 7/2020 | Hinterberger et al. |
| 2020/0235439 A1 | 7/2020 | Frost et al. |
| 2020/0244076 A1 | 7/2020 | Wang et al. |
| 2020/0278936 A1 | 9/2020 | Gopalakrishnan et al. |

(56) References Cited

U.S. PATENT DOCUMENTS

| | | | |
|---|---|---|---|
| 2020/0317086 A1 | 10/2020 | Goetz et al. |
| 2020/0328593 A1 | 10/2020 | Goetz |
| 2020/0338997 A1 | 10/2020 | Goetz et al. |
| 2020/0358370 A1 | 11/2020 | Goetz et al. |
| 2020/0395840 A1 | 12/2020 | Goetz |
| 2021/0005855 A1 | 1/2021 | Götz et al. |
| 2021/0146791 A1 | 5/2021 | Hinterberger et al. |
| 2021/0151726 A1 | 5/2021 | Hinterberger et al. |
| 2021/0151727 A1 | 5/2021 | Hinterberger et al. |
| 2021/0151728 A1 | 5/2021 | Hinterberger et al. |
| 2021/0197676 A1 | 7/2021 | Goetz et al. |

FOREIGN PATENT DOCUMENTS

| | | |
|---|---|---|
| CN | 204156591 | 2/2015 |
| CN | 103812377 | 5/2016 |
| DE | 102014008399 | 12/2015 |
| DE | 102016109077 | 11/2017 |
| DE | 102017220175 | 5/2019 |
| DE | 102018109921 | 8/2019 |
| DE | 102018109922 | 10/2019 |
| DE | 102018109925 | 10/2019 |
| DE | 102018109926 | 12/2019 |
| DE | 102018121403 | 3/2020 |
| DE | 102018121490 | 3/2020 |
| DE | 102018121547 | 3/2020 |
| DE | 102018126780 | 4/2020 |
| DE | 102018129111 | 5/2020 |
| DE | 102018126779 | 6/2020 |
| DE | 102019112826 | 6/2020 |
| DE | 102019102306 | 7/2020 |
| DE | 102019102311 | 7/2020 |
| DE | 102019103757 | 7/2020 |
| DE | 102019120615 | 8/2020 |
| DE | 102019112373 | 11/2020 |
| DE | 102019112823 | 11/2020 |
| DE | 102019120616 | 11/2020 |
| DE | 102019120947 | 11/2020 |
| DE | 102019125577 | 11/2020 |
| DE | 102019125578 | 11/2020 |
| DE | 102019120945 | 2/2021 |
| DE | 102019130736 | 5/2021 |
| DE | 102019130737 | 5/2021 |
| DE | 102019132685 | 6/2021 |
| DE | 102020117264 | 6/2021 |
| DE | 102020117435 | 6/2021 |
| DE | 102020118242 | 7/2021 |
| EP | 0907238 | 4/1999 |
| EP | 2290799 | 3/2011 |
| EP | 2658071 | 10/2013 |
| EP | 2693598 | 2/2014 |
| JP | 2006-271045 | 10/2006 |
| JP | 2012-210143 | 10/2012 |
| JP | 2013-081362 | 5/2013 |
| KR | 2017-0001888 | 1/2017 |
| TW | 201121224 | 6/2011 |
| WO | WO 2011/009689 | 1/2011 |
| WO | WO 2011/082855 | 7/2011 |
| WO | WO 2011/082856 | 7/2011 |
| WO | WO 2011/128133 | 10/2011 |
| WO | WO 2012/016735 | 2/2012 |
| WO | WO 2012/038162 | 3/2012 |
| WO | WO 2013/056900 | 4/2013 |
| WO | WO 2014/151178 | 9/2014 |
| WO | WO 2014/193254 | 12/2014 |
| WO | WO 2016/030144 | 3/2016 |
| WO | WO 2018/072837 | 4/2018 |
| WO | WO 2018/095552 | 5/2018 |
| WO | WO 2018/210451 | 11/2018 |
| WO | WO 2018/210452 | 11/2018 |
| WO | WO 2018/231810 | 12/2018 |
| WO | WO 2018/232403 | 12/2018 |
| WO | WO 2018/233871 | 12/2018 |
| WO | WO 2019/020215 | 1/2019 |
| WO | WO 2019/161875 | 8/2019 |
| WO | WO 2019/166733 | 9/2019 |
| WO | WO 2019/180699 | 9/2019 |
| WO | WO 2019/183553 | 9/2019 |
| WO | WO 2020/078580 | 4/2020 |
| WO | WO 2020/205511 | 10/2020 |
| WO | WO 2020/205574 | 10/2020 |
| WO | WO 2020/243655 | 12/2020 |

OTHER PUBLICATIONS

"Capacitor Voltage Control Technique for a Modular Converter", An IP.com Prior Art Database Technical Disclosure, Jun. 10, 2015, pp. 1-7.

Bode, G.H., et al., "Hysteresis Current Regulation For Single-Phase Multilevel Inverters Using Asynchronous State Machines", 29th Annual Conference of the IEEE Industrial Electronics Society, Piscataway, NJ, 2003, pp. 1203-4208.

Chang, F., et al., "Improving the Overall Efficiency of Automotive Inverters Using a Multilevel Converter Composed of Low Voltage Si MOSFETs", IEEE Transactions on Power Electronics, 2019, vol. 34, No. 4, pp. 3586-3602.

Debnath, S., et al., "Operation, Control, and Applications of the Modular Multilevel Converter: A Review", IEEE Transactions on Power Electronics, 2015, vol. 30, No. 1, pp. 37-53.

EP 18816636.7 Extended Search Report, dated Feb. 19, 2021.

EP 18817541.8 Supplementary Search Report, dated Jan. 20, 2021.

EP 18817541.8 Written Opinion, dated Feb. 2, 2021.

Farr, E., et al., "A Sub-module Capacitor Voltage Balancing Scheme for the Alternate Arm Converter (AAC)", 15th European Conference on IEEE Power Electronics and Applications, 2013, pp. 1-10.

Gelman, V., "Energy Storage That May Be Too Good to Be True", IEEE Vehicular Technology Magazine, 2031, pp. 70-80.

Gupta, R., et al., "Cascaded Multilevel Control of DSTATCOM Using Multiband Hysteresis Modulation", IEEE Power Engineering Society General Meeting, Piscataway, NJ, 2006, pp. 1-7.

Hassanpoor, A., et al., "Tolerance Band Modulation Methods for Modular Multilevel Converters", IEEE Transactions on Power Electronics, 2015, vol. 30, No. 1, pp. 311-326.

Herrera, V. I., et al., "Optimal Energy Management and Sizing of a Battery—Supercapacitor-Based Light Rail Vehicle With a Multiobjective Approach", IEEE Transactions on Industry Applications, 2016, vol. 52, No. 4, pp. 3367-3377.

Kersten, A., "Battery Loss and Stress Mitigation in a Cascaded H-Bridge Multilevel Inverter for Vehicle Traction Applications by Filter Capacitors", IEEE Transactions on Transportation Electrification, 2019, pp. 1-13.

Khoshkbar-Sadigh, A., et al., "Thermal and Performance Comparison of Active Neutral-Point-Clamped (ANPC) and Dual Flying-Capacitor Anpc (DFC-ANPC) Inverters", IEEE Energy Conversion Congress and Exposition (ECCE), 2019, pp. 5522-5528.

Konstantinou, G., et al., "A Hybrid Modular Multilevel Converter with Partial Embedded Energy Storage", Energies, 2016, vol. 9, No. 12, pp. 1-18.

Li, N., et al., "SOH Balancing Control Method for the MMC Battery Energy Storage System", IEEE Transactions on Industrial Electronics, 2018, vol. 65, No. 8, pp. 6581-6591.

Loh, P. C., et al., "A Reduced Common Mode Hysteresis Current Regulation Strategy for Multilevel Inverters", 18th Annual IEEE Applied Power Electronics Conference and Exposition, Miami Beach, FL, 2003, vol. 1, pp. 576-582.

Loh, P. C., et al., "A Time-Based Double-Band Hysteresis Current Regulation Strategy for Single-Phase Multilevel Inverters", IEEE Transactions on Industry Applications, 2003, vol. 39, No. 3, pp. 883-892.

Maharjan, L., et al., "Fault-Tolerant Operation of a Battery-Energy-Storage System Based on a Multilevel Cascade PWM Converter With Star Configuration", IEEE Transactions On Power Electronics, 2010, vol. 25, No. 9, pp. 2386-2396.

Maharjan, L., et al., "State-of-Charge (SOC)-Balancing Control of a Battery Energy Storage System Based on a Cascade PWM Converter", IEEE Transactions on Power Electronics, 2009, vol. 24, No. 6, pp. 1628-1636.

(56) References Cited

OTHER PUBLICATIONS

Méllo, J.P.R., et al., "Multilevel Reduced Controlled Switches AC-DC Power Conversion Cells", IEEE Energy Conversion Congress and Exposition (ECCE), 2015, pp. 3815-3822.

Naderi, R., "Battery Management Converter System and Multilevel Converter Topology and Control", 2016, Dissertation at the University of California, Irvine, pp. 1-211.

Naderi, R., et al., "A Correction to the State-Machine-Decoder for Stacked Multicell Converters", IEEE Applied Power Electronics Conference and Exposition (APEC), 2014, pp. 1545-1549.

Naderi, R., et al., "A New Hybrid Active Neutral Point Clamped Flying Capacitor Multilevel Inverter", IEEE Applied Power Electronics Conference and Exposition (APEC), 2015, pp. 794-798.

Naderi, R., et al., "Dual Flying Capacitor Active-Neutral-Point-Clamped Multilevel Converter", IEEE Transactions On Power Electronics, 2016, vol. 31, No. 9, pp. 6476-6484.

Naderi, R., et al., "Phase-Shifted Carrier PWM Technique for General Cascaded Inverters", IEEE Transactions on Power Electronics, 2008, vol. 23, No. 3, pp. 1257-1269.

P., S., et al., "Seven Level Inverter Topologies: A Comparative Study", International Journal of Innovative Research in Electrical, Electronics, Instrumentation and Control Engineering, 2016, vol. 3, No. 1, pp. 148-162.

Sangiri, J. B., et al., "Modular Multilevel Converter for Multifunctional Battery Management System of Electric Vehicle", 44th Annual Conference of the IEEE Industrial Electronics Society, 2018, pp. 1333-1338.

SG 11201912049P Written Opinion, dated Mar. 10, 2021.

Shimada, M., et al., "Energy-saving Technology for Railway Traction Systems Using Onboard Storage Batteries", Hitachi Review, 2012, vol. 61, No. 7, pp. 312-318.

Tajeddine, K., et al., "A Cascaded H-Bridge Multilevel Inverter with SOC Battery Balancing", International Journal of Advanced Computer Science and Applications, 2017, vol. 8, No. 12, pp. 345-350.

Tolbert et al., "Charge Balance Control Schemes for Cascade Multi-level Converter in Hybrid Electric Vehicles," IEEE Trans. Indus. Electronics, Oct. 2002, 49(5):1058-1064.

Varghese, K., "Implementation of Single Phase Seven Level Cascaded Multilevel Inverter With Reduced No of Switches", Project Report 15, retrieved from https://www.academia.edu/12826368/single_phase_seven_level_cascaded_multilevel_inverter, pp. 1-45.

Venu, K., et al., "A Seven Level Single-Phase Cascaded Inverter with Improved Efficiency", International Journal & Magazine of Engineering, Technology, Management and Research, 2016, vol. 3, No. 10, pp. 243-249.

WO PCT/US18/37081 ISR and Written Opinion, dated Oct. 17, 2018.

WO PCT/US18/38089 ISR and Written Opinion, dated Oct. 29, 2018.

WO PCT/US19/23695 ISR and Written Opinion, dated Aug. 12, 2019.

WO PCT/US21/27154 ISR and Written Opinion, dated Oct. 14, 2021, 19 pages.

WO PCT/US21/27159 ISR and Written Opinion, dated Sep. 1, 2021, 10 pages.

WO PCT/US21/32295 ISR and Written Opinion, dated Sep. 14, 2021, 16 pages.

Wu, B., et al., "Analysis of a distributed maximum power point tracking tracker with low input voltage ripple and flexible gain range", IET Power Electron., 2016, vol. 9, No. 6, pp. 1220-1227.

Zhang, L., et al., "Design and Performance Evaluation of the Modular Multilevel Converter (MMC)-based Grid-tied PV-Battery Conversion System", IEEE Energy Conversion Congress and Exposition (ECCE), 2018, pp. 2649-2654.

\* cited by examiner

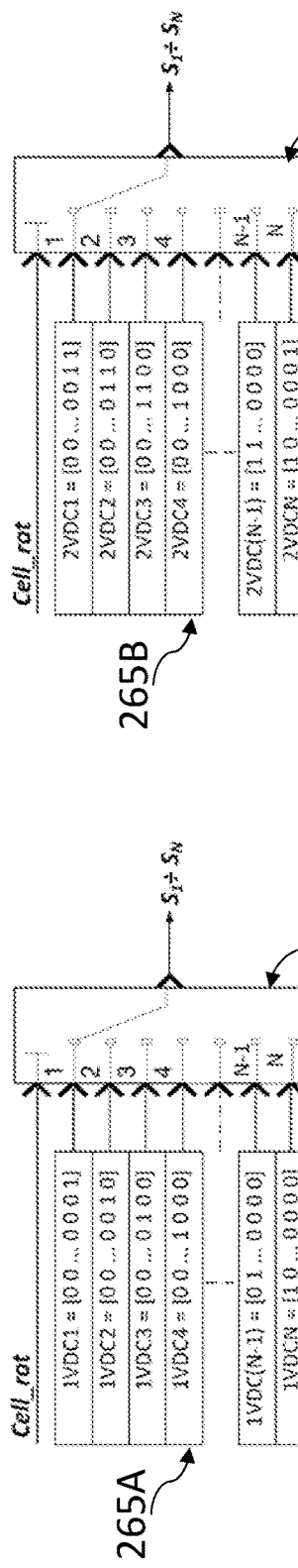
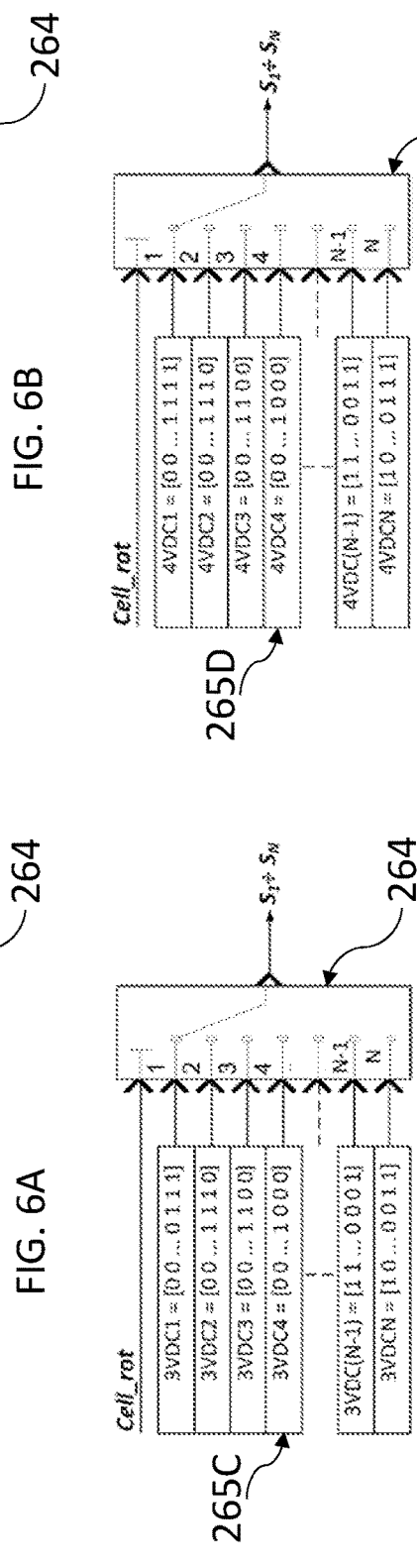
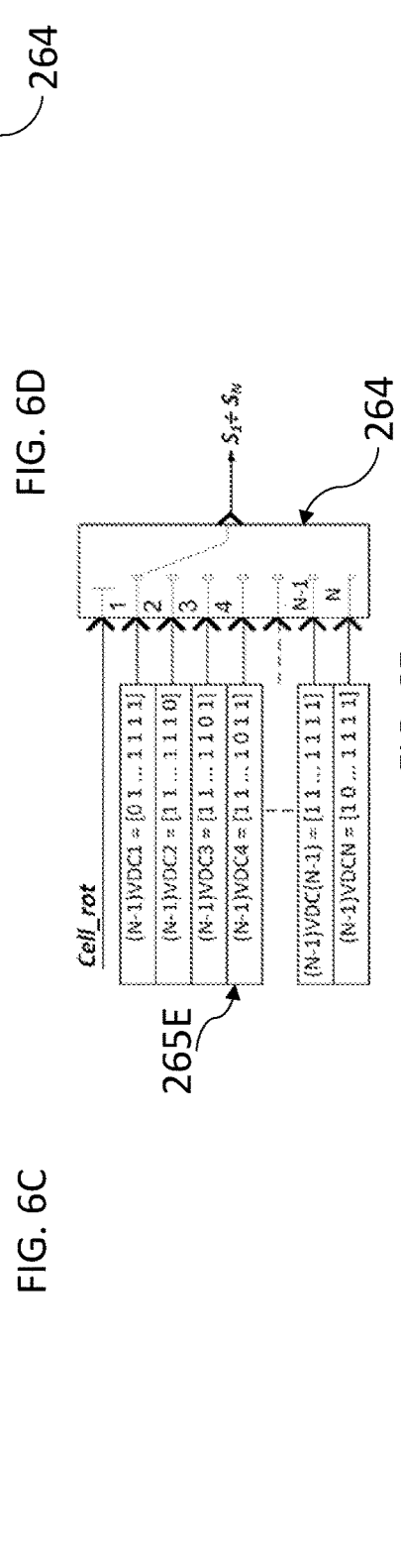
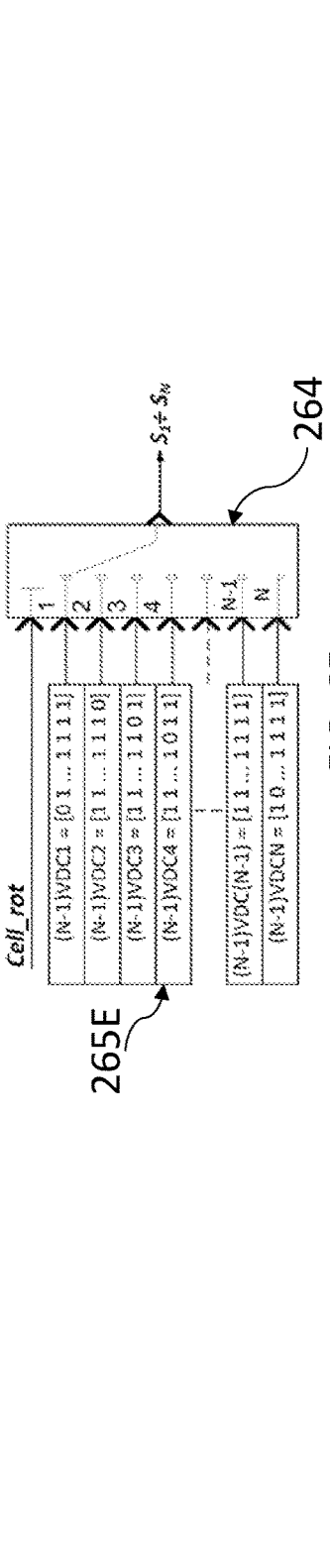
FIG. 6A  FIG. 6B  FIG. 6C  FIG. 6D  FIG. 6E

MULTI-LEVEL HYSTERESIS VOLTAGE CONTROLLERS FOR VOLTAGE MODULATORS AND METHODS FOR CONTROL THEREOF

CROSS-REFERENCE TO RELATED APPLICATIONS

The subject application is a continuation of U.S. patent application Ser. No. 17/409,295, filed Aug. 23, 2021, which is a continuation of U.S. patent application Ser. No. 16/704,797, filed Dec. 5, 2019, now U.S. Pat. No. 11,133,739, which is a continuation of PCT Patent Application No. PCT/US18/38089, filed Jun. 18, 2018, which claims priority to U.S. Provisional Patent Application No. 62/521,227, filed on Jun. 16, 2017, all of which are incorporated by reference herein in their entirety for all purposes.

TECHNICAL FIELD

The present disclosure relates to power electronic circuits, and more particularly to multi-level hysteresis voltage controllers for voltage modulators and methods for control thereof.

BACKGROUND

Voltage modulators have been used widely for broadcast, medical, industrial and research applications. The most common voltage modulation techniques include Pulsed Step Modulation, Coarse Step Modulation, Pulsed Width Modulation, and hybrid modifications thereof.

These common modulation techniques have several drawbacks. For instance, these common modulation techniques are linear methods that require a proportional-integral (PI) controller with an additional feedforward loop in a control system to estimate a modulation index or duty cycle at every step of discretization. In addition, low frequency pulsations of output voltage usually occur in these common modulation techniques due to unbalance of DC-link voltages, variation in parameters of passive elements, and deviations of duty cycles of series connected modules. Lastly, there is a strong correlation between parameters of the PI-controller and load parameters in these common modulation techniques. Therefore, if load characteristics change rapidly and over a wide range, then the PI-controller is not capable of operating efficiently and fast enough to minimize a control error in transient periods.

Hysteresis is a phenomenon in which the response of a physical system to an external influence depends not only on the present magnitude of that influence but also on the previous history of the system. Expressed mathematically, the response to the external influence is a doubled-valued function; one value applies when the influence is increasing, while the other value applies when the influence is decreasing.

Among existing control techniques, nonlinear hysteresis band voltage control remains the simplest and fastest method. Beyond a fast response of a voltage control loop, the nonlinear hysteresis band voltage control method does not require any knowledge of variation of load parameters. However, the hysteresis voltage control technique for voltage modulators becomes increasingly complicated with an increased number of power cells connected in series.

In view of the foregoing limitations, it is desirable to provide a multilevel hysteresis voltage controller (MHVC) for voltage modulators having any number of series connected power cells while providing very accurate voltage regulation in a wide range of load parameters fluctuations.

SUMMARY

The embodiments of the present disclosure are directed to systems and methods that facilitate simple and effective multilevel hysteresis voltage control methods for cascaded multilevel voltage modulators. In embodiments, a cascaded multilevel modulator comprises a plurality of power cells connected in series and has any positive integer number of output voltage levels to quickly, effectively, and precisely control any unipolar voltage on the load of the voltage modulator, and transfer electrical power from an electrical grid via AC/DC converters or directly from energy storage elements of the power cells to that load. The embodiments are also directed to a method of operational rotation of the power cells of a multilevel voltage modulator, which ensures an equal power sharing among the power cells and voltage balancing of the energy storage elements of the power cells of the modulator.

The embodiments presented herein may advantageously be used in a variety of applications in which voltage regulated modulators are employed. Examples of such applications may include, without limitation, power electronics circuits comprising: electrode biasing power supplies for Tokamak and FRC plasma reactors; power supplies for neutral beam injectors; magnetron modulators; klystron modulators; E-gun modulators; high power X-ray power supplies; mediumwave and longwave transmitters; and shortwave solid-state transmitters.

Other systems, methods, features and advantages of the example embodiments will be or will become apparent to one with skill in the art upon examination of the following figures and detailed description.

BRIEF DESCRIPTION OF THE DRAWINGS

The details of the example embodiments, including structure and operation, may be gleaned in part by study of the accompanying figures, in which like reference numerals refer to like parts. The components in the figures are not necessarily to scale, emphasis instead being placed upon illustrating the principles of the disclosure. Moreover, all illustrations are intended to convey concepts, where relative sizes, shapes and other detailed attributes may be illustrated schematically rather than literally or precisely.

FIG. 6A illustrates an exemplary 1VDC rotation block according to embodiments of the present disclosure.

FIG. 6B illustrates an exemplary 2VDC rotation block according to embodiments of the present disclosure.

FIG. 6C illustrates an exemplary 3VDC rotation block according to embodiments of the present disclosure.

FIG. 6D illustrates an exemplary 4VDC rotation block according to embodiments of the present disclosure.

FIG. 6E illustrates an exemplary (N−1)VDC rotation block according to embodiments of the present disclosure.

It should be noted that elements of similar structures or functions are generally represented by like reference numerals for illustrative purpose throughout the figures. It should also be noted that the figures are only intended to facilitate the description of the preferred embodiments.

DETAILED DESCRIPTION

Figure 1:
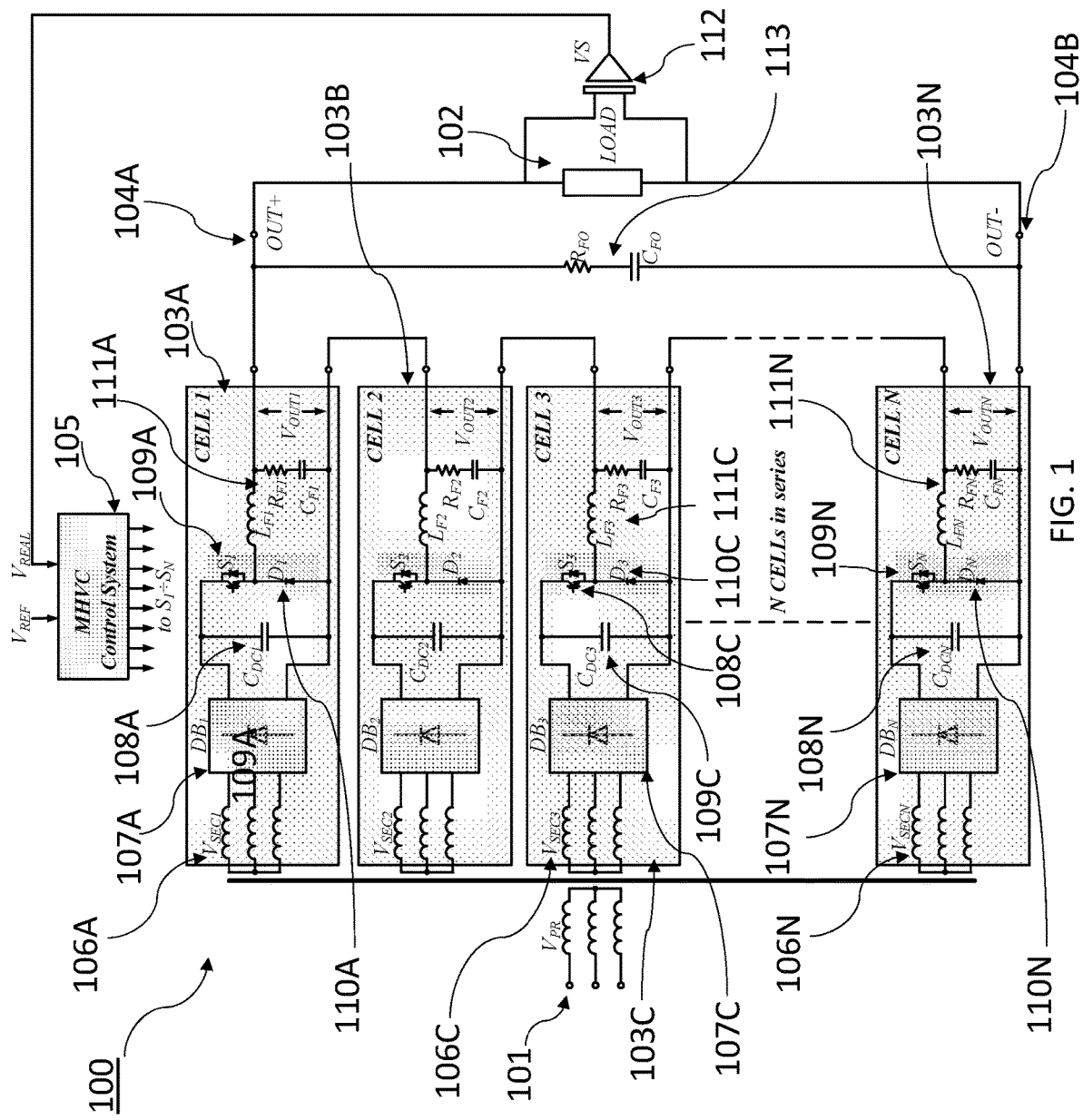
FIG. 1 illustrates a schematic of a multi-level voltage modulator according to embodiments of the present disclosure.

The following embodiments are described in detail to enable those skilled in the art to make and use various embodiments of the present disclosure. It is understood that other embodiments would be evident based on the present disclosure, and that system, process, or changes may be made without departing from the scope of the present embodiments.

In the following description, numerous specific details are given to provide a thorough understanding of the present embodiments. However, it will be apparent that the present embodiments may be practiced without these specific details. In order to increase clarity, some well-known circuits, system configurations, and process steps may not be described in detail.

The drawings showing embodiments of the present disclosure are semi-diagrammatic and not to scale and, particularly, some of the dimensions are for the clarity of presentation and are shown exaggerated in the drawing Figures.

The embodiments of the present disclosure are directed to systems and methods that facilitate simple and effective multilevel hysteresis voltage control methods for cascaded multilevel voltage modulators. In embodiments, a cascaded multilevel modulator comprises a plurality of power cells connected in series and has any positive integer number of output voltage levels to quickly, effectively, and precisely control any unipolar voltage on the load of the voltage modulator, and transfer electrical power from an electrical grid via AC/DC converters or directly from energy storage elements of the power cells to that load. The embodiments are also directed to a method of operational rotation of the power cells of a multilevel voltage modulator, which ensures an equal power sharing among the power cells and voltage balancing of the energy storage elements of the power cells of the modulator In embodiments, an exemplary multilevel hysteresis voltage controller (MHVC) has a robust structure, which is free from the above-mentioned drawbacks and does not have any additional regulation loops other than a voltage hysteresis loop. The output voltages of all power cells of the voltage modulator are adjusted dynamically and in an automated manner by MHVC to maintain a minimum preset value of output voltage regulation error, excluding an influence of variation of parameters of passive components and the propagation delays of control signals on the output voltage oscillations. There are three major and interlinked tasks that are performed by the MHVC: 1) maintenance of an voltage modulator's output voltage within the preset boundaries of regulation error; 2) identification of appropriate output voltage level at any moment of time; and 3) rotation of the power cells.

Embodiments are directed to a fast MHVC design which can be realized on any FPGA or similar design component and can be operated at a high clock rate (tens of megahertz). The design comprises a hysteresis block, a voltage level estimator as described herein, and a switching pattern generator as described herein.

FIG. 1 illustrates a schematic of a multi-level voltage modulator (voltage modulator) 100 according to embodiments of the present disclosure. A multi-level voltage modulator 100 is connected to a three-phase grid 101 on a lower voltage side and to a load 102 on higher voltage side, as well as a control system 105 having a MHVC. Functions of the control system 105 may be implemented using either software or hardware processors including software routines, hardware components, or combinations thereof.

The exemplary multi-level voltage modulator 100 comprises N series connected cells 103A-103N, where each cell 103A-103N comprises a secondary winding of isolation transformer ($V_{SECN}$) 106A-106N connected to a three-phase diode bridge ($DB_N$) 107A-107N, a capacitive storage element ($C_{DCN}$) 108A-108N on a DC side (DC-link) of the $DB_N$ 107A-107N, and a standard buck converter with an active bidirectional switch ($S_N$) 109A-109N (e.g., for high voltage modulators the $S_N$ may include IGBT with freewheeling diode, while for lower voltage modulators the $S_N$ may include low voltage MOSFETs) and a diode ($D_N$) 110A-110N. It will be appreciated that N is a positive integer. Each cell 103A-103N may also be equipped with an optional LCR filter ($L_{FN}$, $C_{FN}$, $R_{FN}$) 11A-111N at its output and the voltage modulator 100 may also be equipped with an optional CR filter ($C_{FO}$, $R_{FO}$) 113 at its output. The DC-links of all of the power cells 103A-103N are isolated from each other at the maximum load voltage level by means of a three-phase multi-winding transformer ($V_{SECN}$) 106A-106N.

The voltage modulator 100 is assumed to be working in continuous mode, transferring the energy from the three-phase grid 101 to the load 102. It is also possible to operate the voltage modulator 100 completely disconnected from the grid 101 for a certain period of time using the energy accumulated in the storage elements (e.g., capacitors, supercapacitors, batteries) 108A-108N of the cells 103A-103N if the voltage on the storage elements 108A-108N is not significantly reduced during an operational time in order to maintain a desired output voltage on the load 102.

Each DC-link voltage of the voltage modulator's 100 power cells 103A-103N of the voltage modulator 100 may be considered a DC voltage source of a fixed magnitude ($VC_{DCN}$) which, in practice according to certain embodiments, may be on the order of 12 to 1200 Volts. The total voltage across the series connected power cells 103A-103N (i.e., between terminals OUT+ 104A and OUT− 104B) is dependent upon the number of cells that have been turned on by closure of the associated switches $S_1$ through $S_N$ 109A-109N. For example, if all of the switches $S_1$ through $S_N$ 109A-109N are closed at the same time, then all of DC-link storage elements (e.g., capacitors) with voltage $V_{DC1-N}$ are connected together in series and added together (i.e., summed) to provide an output voltage equal to N times voltage $V_{DC1-N}$. If each DC-link voltage source $V_{DC1-N}$ has a value on the order of 800 Volts and N is on the order of 20, then the total output voltage of the voltage modulator 100 may be on the order of 16,000 Volts.

If the switch $S_N$ 109N in the power cell 103N is open (i.e., not in conducting mode) then this particular cell is "bypassed" and its output voltage is zero. Thus, the output voltage of the voltage modulator 100 can be synthesized and modulated by the number of cells that are turned ON and OFF.

Referring to FIG. 1 to contrast, in the standard Pulse Step Modulation (PSM) technique, if there are N power cells in series in a voltage modulator and each cell has a commutation period T(s), the switch S1 of CELL 1 will be switched on at time t1, but the switch S2 of CELL 2 is turned on T/n (s) later than the first one, the third (S3) is turned on 2T/n(s) later than the second (S2), and so on. This rotation method of PSM ensures very low ripples at the output of the voltage modulator, as their amplitude is reversely proportional to the frequency of AC component $f_{AC}$ of the output voltage of the voltage modulator. All power cells are switched at the same fixed switching frequency $f_{SW}$, then $f_{AC}=N*f_{SW}$.

Regulation of the output voltage using PSM is performed via linear regulation concepts (PI, feedforward or their combination) by calculating the required number of power cells which have to be turned on (Coarse Step Modulation), and/or regulation of duty cycle D (Pulse Width Modulation), which has to be the same for all power cells in case the passive components ($C_{DC}$, $L_F$, $R_F$, $C_F$) of all power cells are absolutely identical, the stray capacitances are the same, as well as the propagation delays of the control signals. However, in reality all passive components always have a slight variation of parameters, and the propagation delays of control signals for power cells are not always the same. As a result, each power cell has to be switched on with a different required duty cycle $D_N$, which has to be corrected in PSM based control system by additional regulation loop using a DC-link voltage feedback signal. Moreover, additional adjustment of turn on times t1, t2 . . . tN can be necessary to eliminate the low frequency oscillations of output voltage of the voltage modulator.

As discussed above, embodiments herein are directed to a multilevel hysteresis voltage controller (MHVC) having a robust structure, which is free from the above-mentioned drawbacks and does not have any additional regulation loops other than a single voltage hysteresis loop. The output voltages of all power cells 103A-103N of the voltage modulator 100 are adjusted dynamically and in an automated manner by the MHVC to maintain a minimum preset value of output voltage regulation error, excluding an influence of variation of parameters of passive components and the propagation delays of control signals on the output voltage oscillations.

Figure 2:
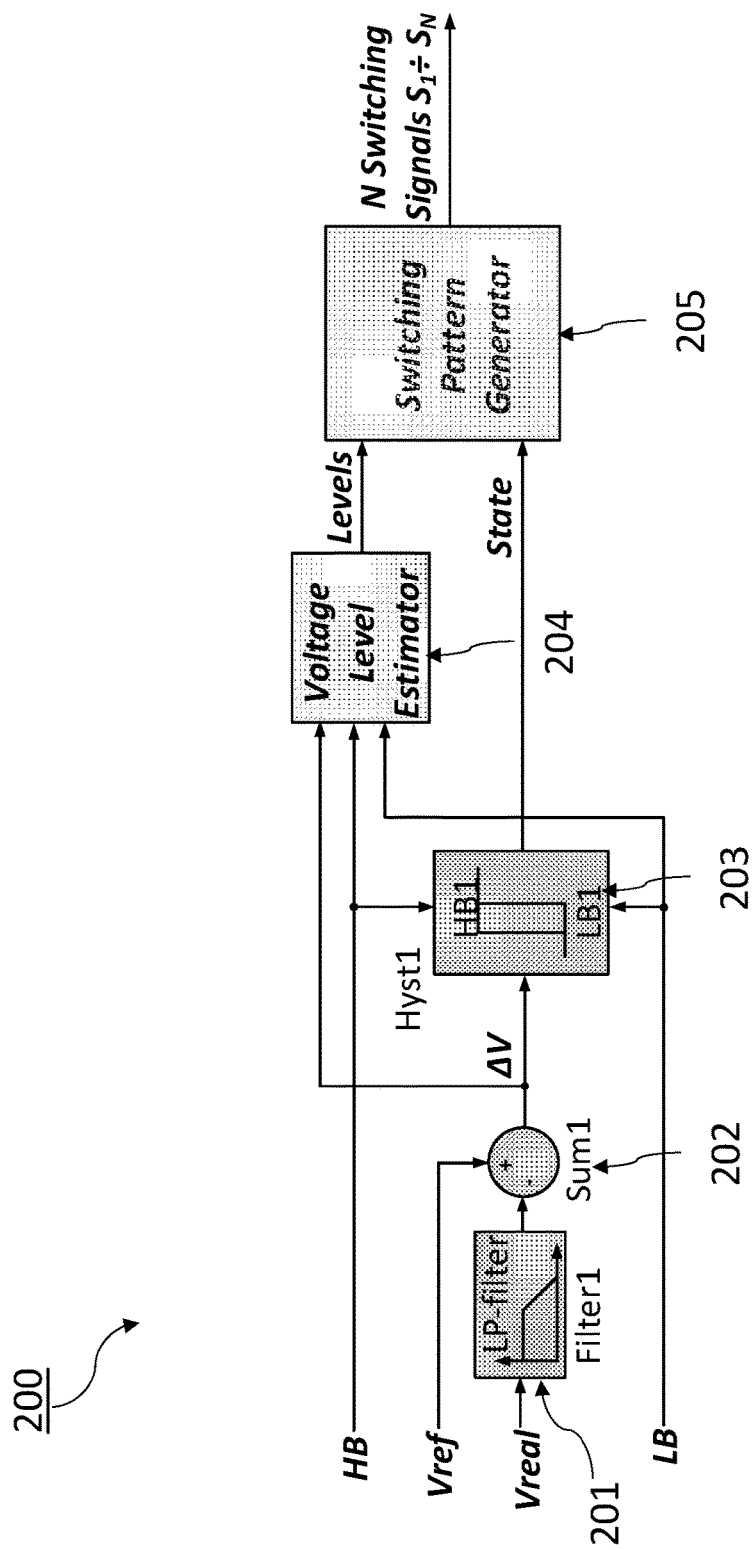
FIG. 2 illustrates an exemplary multi-level hysteresis voltage controller according to embodiments of the present disclosure.

FIG. 2 illustrates an exemplary multi-level hysteresis voltage controller 200 of the control system 105 (see FIG. 1) according to embodiments of the present disclosure. An exemplary multi-level hysteresis voltage controller 200 comprises a low pass filter (LP-filter) Filter1 201, a summation block Sum1 202, a hysteresis block Hyst1 203, a voltage level estimator 204, and a switching pattern generator 205. A real feedback voltage signal $V_{REAL}$ from a voltage sensor VS 112 (see FIG. 1) goes through a low pass filter Filter1 201 to a negative input of the summation block Sum1 202, where it is subtracted from the reference voltage $V_{REF}$ to generate a voltage error signal ΔV, as their difference. The voltage error signal ΔV is input into the hysteresis block Hyst1 203, which has the settings of high boundary (HB) and low boundary (LB) thresholds. When ΔV reaches the high boundary (HB) of the hysteresis block Hyst1 203, the output value of the hysteresis block Hyst1 203 is set to "1" and remains at this level until ΔV crosses its low boundary (LB) of the hysteresis block Hyst1 203. When ΔV crosses its low boundary (LB) of the hysteresis block Hyst1 203, the output value of the hysteresis block Hyst1 203 is set to "0" and the output is maintained at this level until ΔV reaches HB again.

Figure 3:
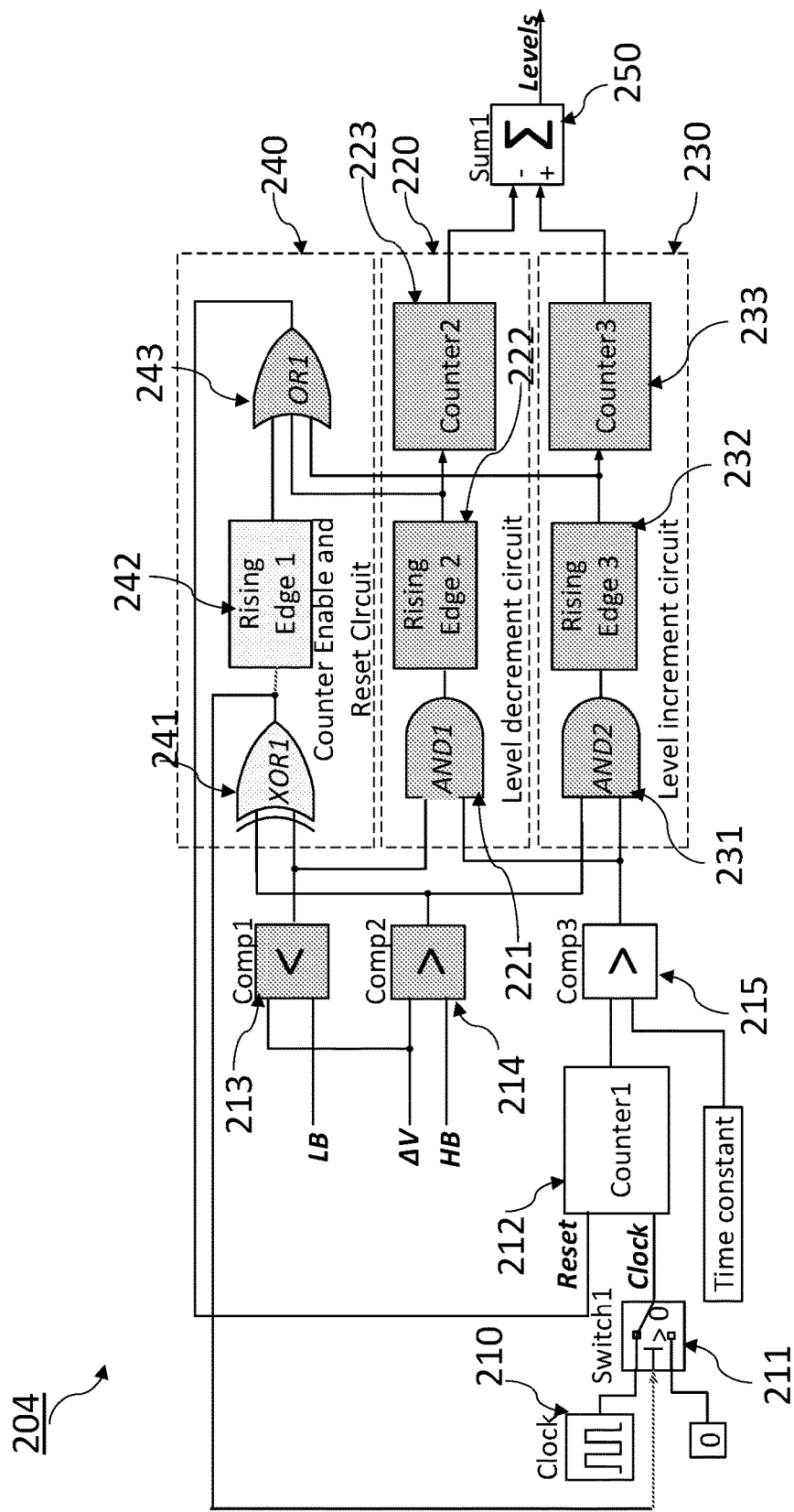
FIG. 3 illustrates an exemplary voltage level estimator according to embodiments of the present disclosure.
Figure 4A:
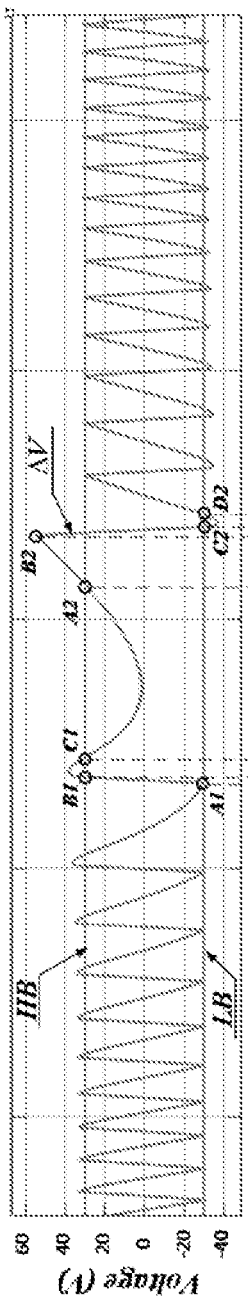
FIGS. 4A, 4B, 4C, and 4D illustrate exemplary operation of an exemplary voltage level estimator according to embodiments of the present disclosure.
Figure 4B:
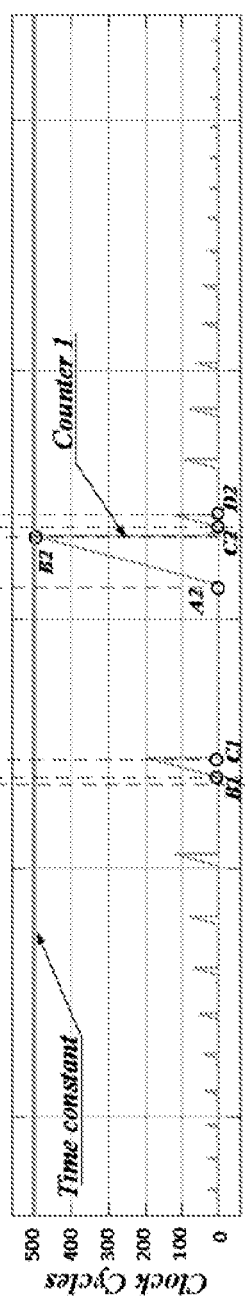
Figure 4C:
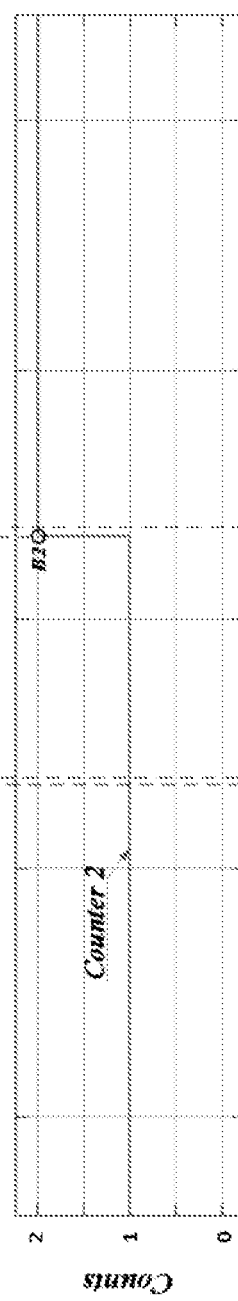
Figure 4D:
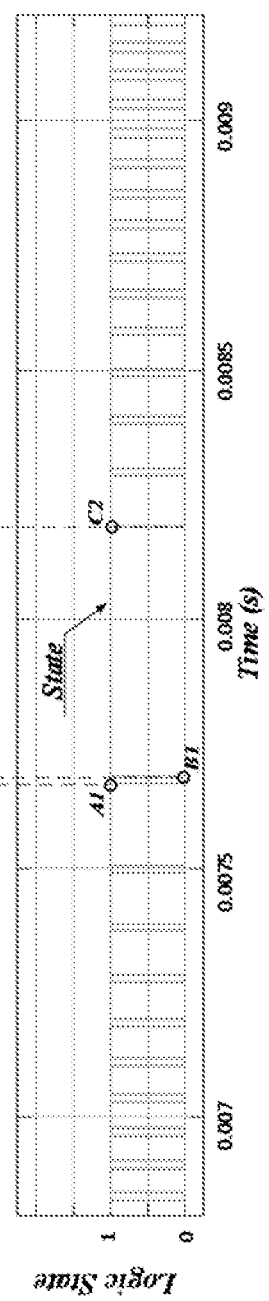

FIG. 3 illustrates an exemplary voltage level estimator 204 according to embodiments of the present disclosure. FIGS. 4A-4D illustrate exemplary operation of the exemplary voltage level estimator 204 according to embodiments of the present disclosure.

The voltage level estimator 204 operates in parallel with the hysteresis block Hyst1 203. The voltage level estimator 204 receives the same HB and LB setting signals together with ΔV from the output of summation block Sum1 202. The exemplary voltage level estimator 204 comprises a clock counting circuit formed by a clock generator Clock 210, a logic switch Switch1 211 and a resettable counter Counter1 212. The exemplary voltage level estimator 204 further comprises a level decrement circuit 220 comprising a logic element AND1 221, a rising edge detector Rising Edge 2 222 and a free running counter Counter2 223. The exemplary voltage level estimator 204 further comprises a level increment circuit 230 having a logic element AND2 231, a rising edge detector Rising Edge 3 232 and a free running counter Counter3 233. The exemplary voltage level estimator 204 further comprises an enable and reset circuit 240 for Counter1 212, which comprises of a logic element XOR1 241, a rising edge detector Rising Edge 1 242 and a logic element OR1 243. The exemplary voltage level estimator 204 further comprises a summation block Sum1 250.

The block Counter1 212 is enabled when the clock signal goes through the upper input channel of Switch1 211 (in case of a True signal on its middle input channel), and starts counting a number of clock cycles generated by the Clock 210 in any of the following cases: If the output of Comp1 213 is True, i.e. the signal ΔV is lower than the low boundary hysteresis threshold LB (ΔV<LB). This case is illustrated in FIGS. 4A-4D, where at the point C2 the signal ΔV becomes lower than LB and the Counter1 212 starts incrementing a count until ΔV returns to the hysteresis boundaries at the point D2 and the output signal of Comp1 213 becomes False; If the output of Comp2 214 is True, i.e. the signal ΔV is higher than the high boundary hysteresis threshold HB (ΔV>HB). This case is illustrated in FIGS. 4A-4D, where at the point B1 the signal ΔV becomes higher than HB and the Counter1 212 starts incrementing a count until ΔV returns to the hysteresis boundaries at the point C1 and the output signal of Comp2 214 becomes False.

The block Counter2 223 increments its output counting signal, which is applied to the negative input of summation block Sum1 250, decrementing a number of Levels at the output of voltage level estimator 204, if both of the following cases are true at the same time: If the output of Comp1 213 is True, i.e. the signal ΔV is lower than the low boundary hysteresis threshold LB (ΔV<LB); If the value of the output counting signal of Counter1 212 is higher than a preset value of Time Constant (in cycles).

If both of the above mentioned conditions are satisfied, then the output of AND1 221 becomes True and this fact is detected by the block Rising Edge 2 222, which generates a pulse of one clock cycle duration, and the block Counter2 223 increments and holds its output count decrementing a value at the output of Sum1 250 (the signal Levels at the output of voltage level estimator 204).

The block Counter3 233 increments its output counting signal, which is applied to the positive input of summation block Sum1 250, incrementing a number of Levels at the output of voltage level estimator 204, if both of the following cases are true at the same time: If the output of Comp2 214 is True, i.e. the signal ΔV is higher than the high boundary hysteresis threshold HB (ΔV>HB); If the value of the output counting signal of Counter1 212 is higher than a preset value of Time Constant (in cycles).

If both of the above mentioned conditions are satisfied, then the output of AND2 231 becomes True and this fact is detected by the block Rising Edge 3 232, which generates a pulse of one clock cycle duration, and the block Counter3 233 increments and holds its output count incrementing a value at the output of Sum1 250 (signal Levels at the output of voltage level estimator 204).

This case of incrementing of levels signal (increment of Counter3 233) is illustrated in FIGS. 4A-4D, where the point A2 satisfies the first of two presented above conditions and the point B2 corresponds to the second condition, when the output counting signal of Counter1 212 is higher than a value of Time Constant preset at 500 clock cycles.

There are three conditions to be true to reset the Counter1 212 as can be seen from FIG. 3. If one of the output signals of the blocks Rising Edge 1 242, Rising Edge 2 222 and Rising Edge 3 232 is True, then the output of block OR1 243 is also True what actually resets the Counter1.

Figure 5:
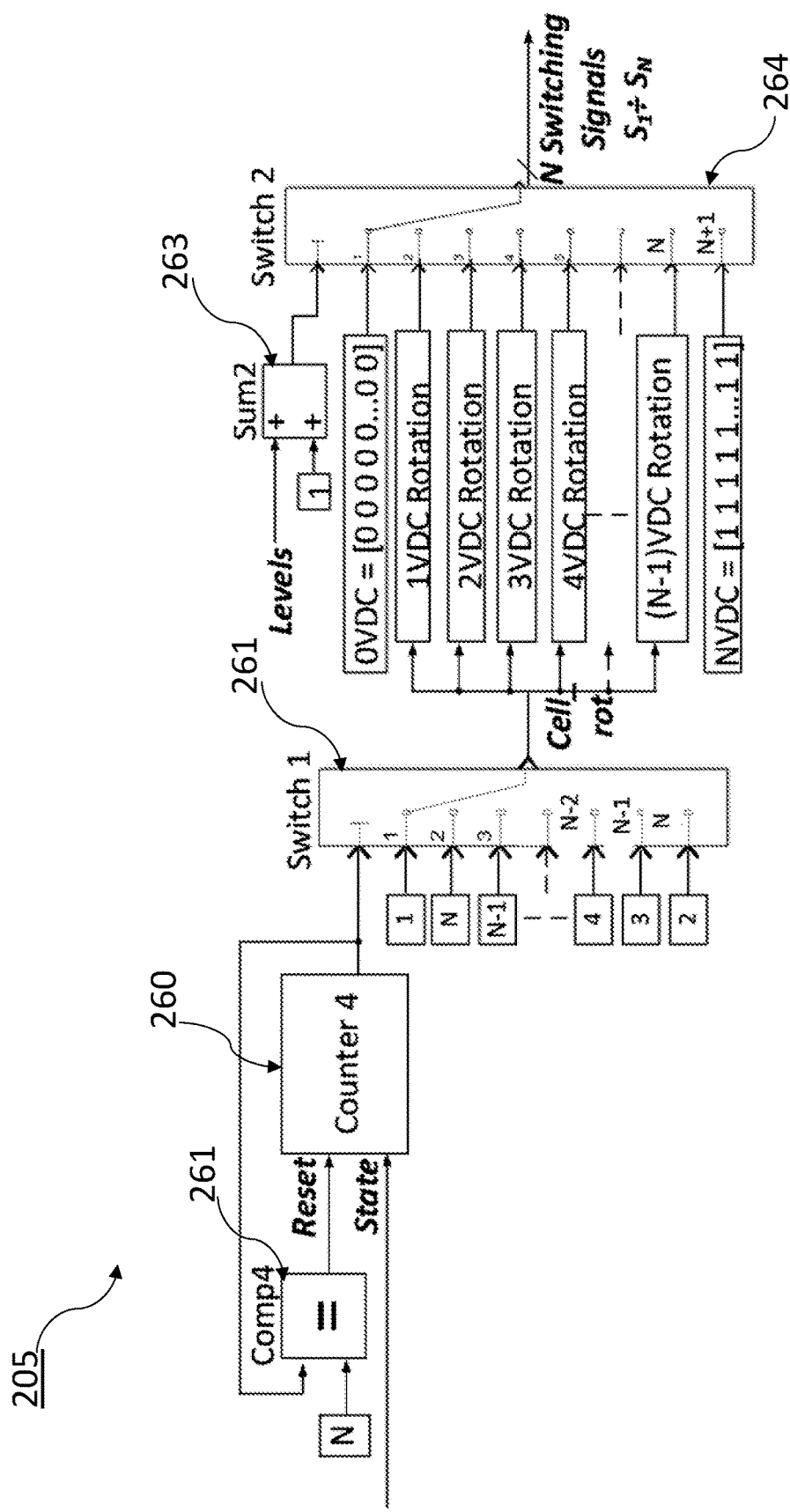
FIG. 5 illustrates an exemplary switching pattern generator according to embodiments of the present disclosure.
Figures 7A, 7B, 7C, 7D:
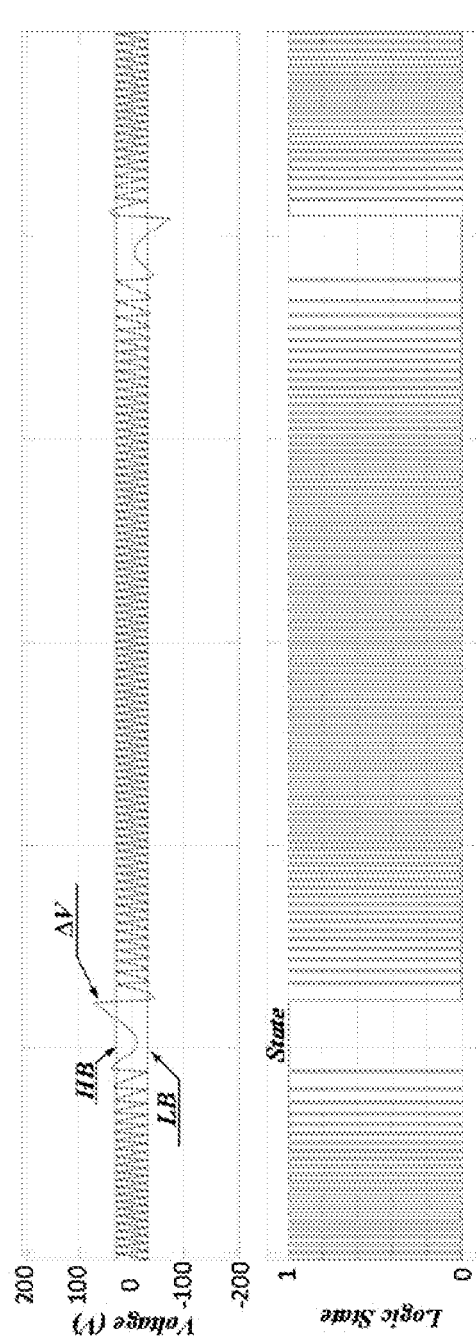
FIGS. 7A, 7B, 7C, and 7D illustrate exemplary operation of an exemplary switching pattern generator according to embodiments of the present disclosure.

FIG. 5 illustrates an exemplary switching pattern generator 205 according to embodiments of the present disclosure. The exemplary switching pattern generator enables a unique method of rotation of an operation duty of the power cells 103A-103N of voltage modulator 100, which ensures an automatic power sharing among the power cells 103A-103N, as well as an adjustment of duty cycle and phase shift of commutation of each power cell 103A-103N.

In embodiments, the exemplary switching pattern generator 205 comprises a resettable Counter4 260 with a reset signal forming a circuit based on the comparator block Comp4 262. The exemplary switching pattern generator 205 further comprises a multiplexer Switch 1 263 with N input signals of constant values from 1 to N, where N is a number of power cells of voltage modulator 100. The exemplary switching pattern generator 205 further comprises a multiplexer Switch 1 263 with N+1 input signals, where each input signal is represented as an array of switching states and N−1 of them (1VDC Rotation, 2VDC Rotation . . . (N−1) VDC Rotation) are dynamic arrays and only two arrays OVDC and NVDC are static and have the constant values. The exemplary switching pattern generator 205 receives the signal Levels from voltage level estimator 204 and the signal State form the hysteresis block Hyst1 203. The output signals of the switching pattern generator 205 are N switching commands to all N switching elements (said IGBTs) of voltage modulator 100.

FIGS. 7A-7D illustrate exemplary operation of the exemplary switching pattern generator 205 according to embodiments of the present disclosure. The exemplary switching pattern generator for which operation is depicted in FIGS. 7A-7D is implemented in a seven-level voltage modulator consisting of seven power cells.

The Counter4 260 increments its output value at every rising edge of the signal State (see FIGS. 7A-7D) up to value N, which sets the output of Comp4 261 to True and resets the Counter4 260. This output signal of Counter4 260 chooses a constant value at the corresponding input of the multiplexer Switch 1 262 at every count and redirects it to the output of the multiplexer Switch 1 262 forming the signal Cell_rot, which is presented in FIGS. 7A-7D. Thus, the signal Cell_rot is changed repetitively from N to 1 with a decrement of 1 at every rise edge of the signal State.

The signal Levels coming from the voltage level estimator 204 passes through the summation block Sum2 263, where it is incremented by 1, and goes to the control input of the multiplexer block Switch 2 264. This multiplexer commutates N+1 arrays of switching states corresponding to the output voltage levels from 0VDC, when all switching signals are False (zero volts at the output of voltage modulator 100) to NVDC level, corresponding to the maximum output voltage of voltage modulator 100, when all switching signals are True. These two voltage levels, the minimum and the maximum output voltage levels, are created by the static arrays (OVDC and NVDC, see FIG. 5) of switching states (signals) of the voltage modulator 100 and no rotation of power cells is required.

The functional diagrams of N−1 blocks of dynamic arrays from 1VDC Rotation to (N−1)DC rotation are presented in FIGS. 6A-6E.

FIG. 6A illustrates an exemplary 1VDC rotation block 265A according to embodiments of the present disclosure. FIG. 6B illustrates an exemplary 2VDC rotation block 265B according to embodiments of the present disclosure. FIG. 6C illustrates an exemplary 3VDC rotation block 265C according to embodiments of the present disclosure. FIG. 6D illustrates an exemplary 4VDC rotation block 265D according to embodiments of the present disclosure. FIG. 6E illustrates an exemplary (N−1)VDC rotation block 265E according to embodiments of the present disclosure.

Each of the blocks 265A-265E depicted in FIGS. 6A-6E comprises a multiplexer with a control input, which receives a signal Cell_rot from the block Switch 2 264, and having N commutated inputs. Each of the blocks 265A-265E depicted in FIGS. 6A-6E further comprises N static arrays containing the specific switching states for correct rotation of the power cells 103A-103N of voltage modulator 100.

If the signal Levels takes the values 0 and 1 only, performing a regulation of the output voltage of the voltage modulator 100 between OVDC and 1VDC levels, then the 1VDC rotation block 265A is involved in operation together with a static array OVDC. As can be seen from FIG. 6A, each of N static arrays from 1VDC1 to 1VDCN of the block 1VDC rotation has only one high (True) switching state, which position in array depends on a value of signal Cell_rot. For example if Cell_rot=1, then only first power cell 103A is operated providing a voltage of its storage element to the output of voltage modulator 100 via opened switching element $S_1$ 109A (e.g., an IGBT) while all other power cells 103B-103N are bypassed. A rotation of the power cells involved in providing 1VDC level of output voltage is ensured by the signal Cell_rot, which is changed repetitively from N to 1 with a decrement of 1 at every rise edge of the signal State.

If the signal Levels takes the values 1 and 2 only, performing a regulation of the output voltage of the voltage modulator 100 between 1VDC and 2VDC levels, then the 1VDC rotation block 265A and the 2VDC rotation block 265B are involved in operation together. As can be seen from FIG. 6B, each of N static arrays from 2VDC1 to 2VDCN of the 2VDC rotation block 265B has two high (True) switching states, which positions in array depend on a value of signal Cell_rot. For example if Levels=2 and Cell_rot=1, then the first and the second power cells 103A and 103B are operated providing a sum of the voltages of their storage elements to the output of voltage of the voltage modulator 100 via opened switching elements $S_1$ and $S_2$ (109A and 109B) while all other power cells 103C-103N are bypassed. When the signal Levels changes to 1 at every rising edge of the signal State, then only one power cell remains connected to the output and its number will be decremented by 1, because the signal Cell_rot is changed also with a rising edge of the signal State. In this case a rotation of the power cells involved in providing 1VDC and 2VDC levels of output voltage is ensured not only by the signal Cell_rot, which is changed repetitively from N to 1 with a decrement of 1 at every rise edge of the signal State, but by the distribution of the high (said True) switching states in the dynamic arrays of both the 1VDC and 2VDC rotation blocks 265A and 265B.

Figure 8:
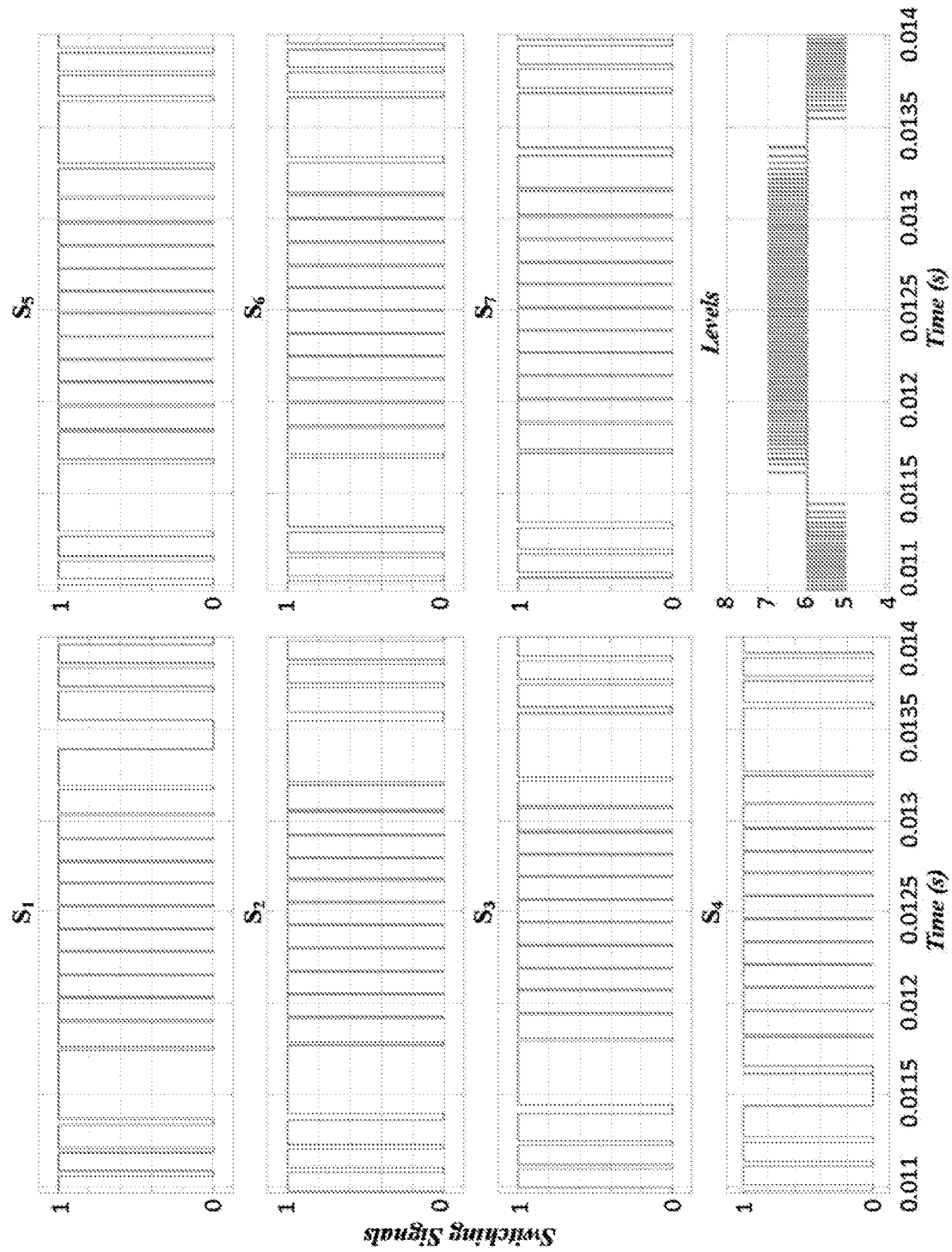
FIG. 8 illustrates exemplary switching and Levels signals for an exemplary seven (7) level voltage modulator according to embodiments of the present disclosure.

FIG. 8 illustrates exemplary switching signals for an exemplary seven (7) level voltage modulator according to embodiments of the present disclosure. FIG. 8 provides an example of the operation of the switching pattern generator 205 for a case of a seven-level voltage modulator comprising seven power cells connected in series. As can be seen from FIG. 8, the Levels signal is changed first from 5 to 6 when the voltage modulator 100 provides an output voltage between 5VDC and 6VDC levels, and then the Levels signals is switched between 6 and 7, when the voltage modulator 100 regulates its output voltage between 6VDC and 7VDC levels. In both cases the switching signals $S_1$-$S_7$ (109A-109G) are shifted from each other ensuring a rotation of the power cells with an equal distribution of consumed power and providing an output frequency of the output voltage to be seven times higher than the switching frequency of each individual power cell.

Figure 9A:
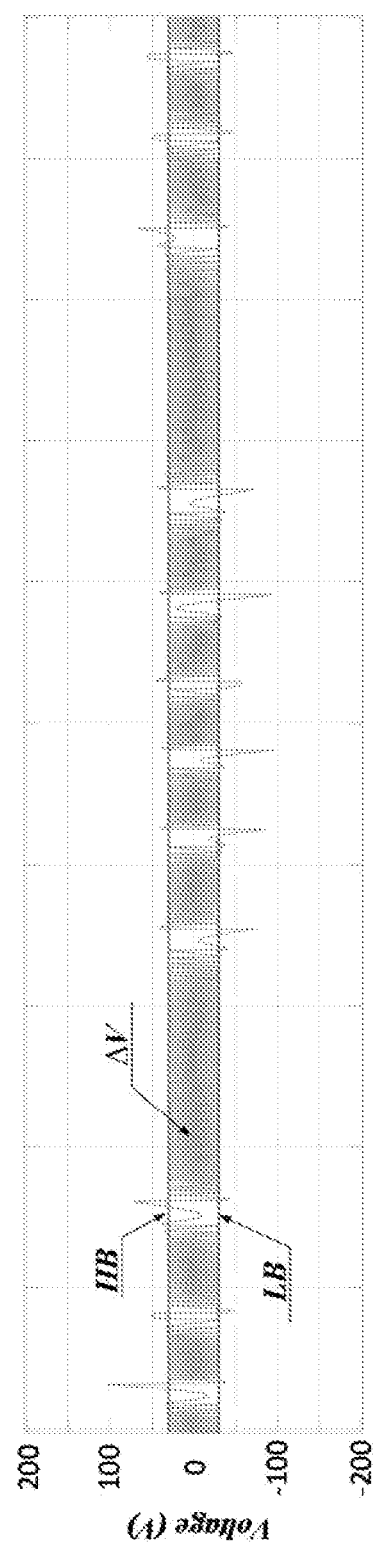
FIGS. 9A, 9B, and 9C illustrate simulation results of operation of the exemplary seven (7) level voltage modulator according to embodiments of the present disclosure.
Figure 9B:
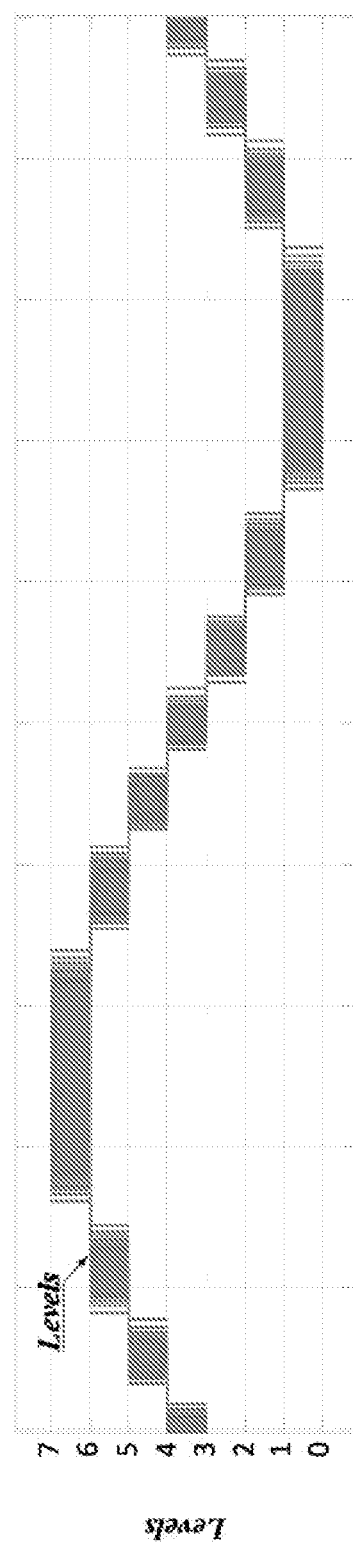
Figure 9C:
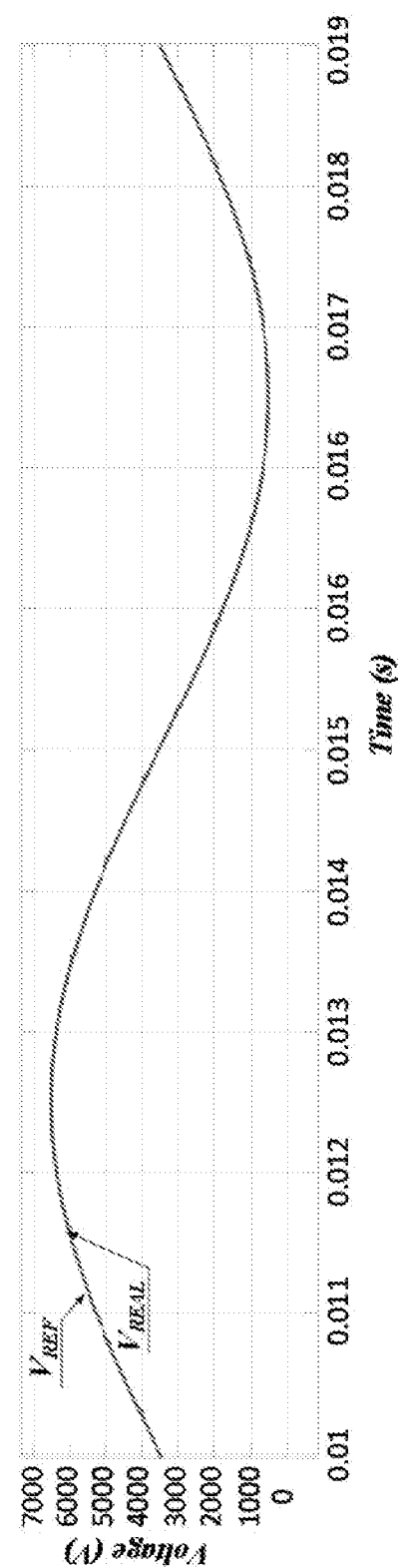
Figure 10A:
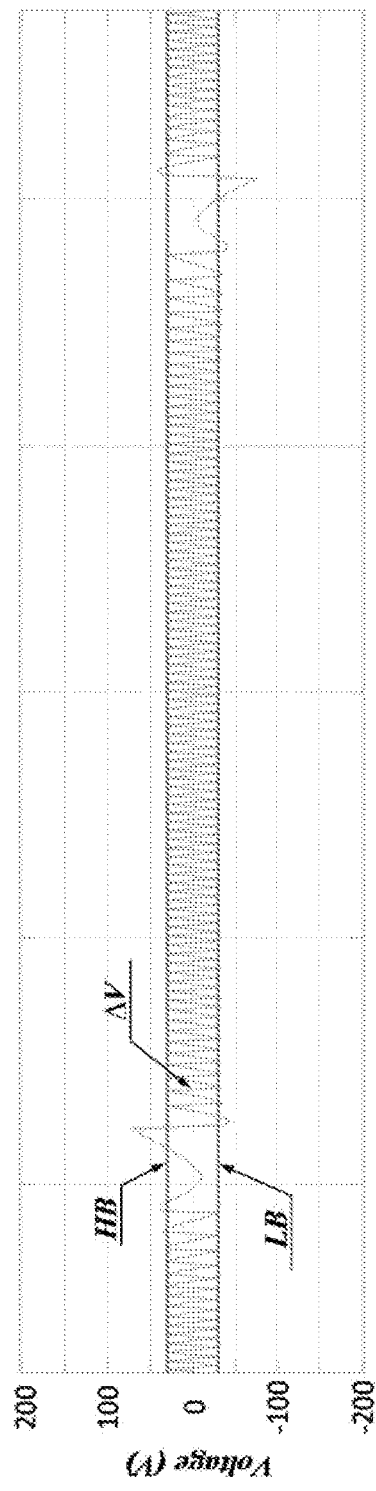
FIGS. 10A, 10B, and 10C illustrate simulation results (zoomed traces) of operation of the exemplary seven (7) level voltage modulator according to embodiments of the present disclosure.
Figure 10B:
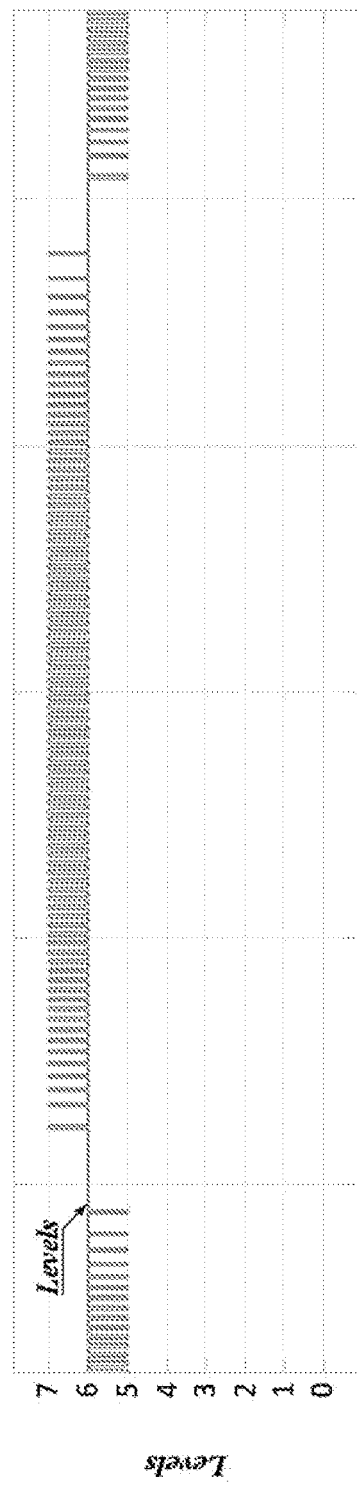
Figure 10C:
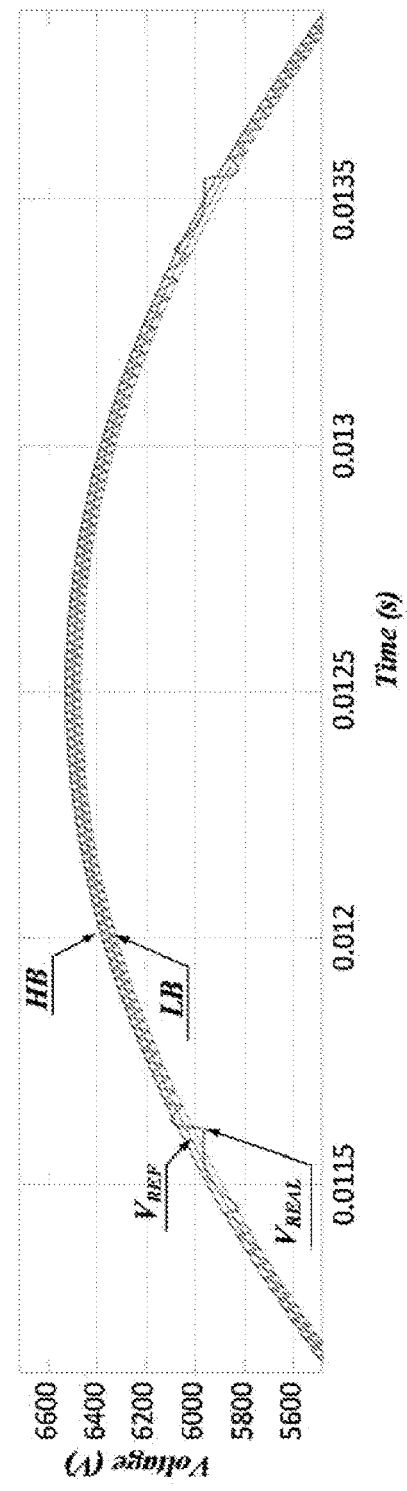

FIGS. 9A-9C illustrates simulation results of operation of the exemplary seven (7) level voltage modulator according to embodiments of the present disclosure. FIG. 10 illustrates simulation results (zoomed traces) of operation of the exemplary seven (7) level voltage modulator according to embodiments of the present disclosure. The seven-level voltage modulator comprises seven power cells connected in series. The reference output voltage $V_{REF}$ is a sinusoidal waveform of 100 Hz with amplitude of 3 kV and DC-offset of 3.5 kV, thus a maximum output voltage is 6.5 kV and the minimum value is 0.5 kV (FIGS. 9A-9C). The proposed multi-level hysteresis voltage controller operates in such a way to maintain a regulation error $\Delta V$ in boundaries of preset values of HB and LB (30V and −30V respectively, see FIGS. 9A-9C and FIGS. 10A-10C). An overshoot of $\Delta V$ in the level transition regions depends on the Time Constant value and can be reduced further to the certain level by adjusting a value of Time Constant. The signal Levels presented in FIGS. 9A-9C and FIGS. 10A-10C is increasing and decreasing following the reference voltage dynamic. The real output voltage $V_{REAL}$ is maintained around $V_{REF}$ with a regulation error $\Delta V$.

FIGS. 11A-11C and FIGS. 12A-12C show the experimental results of a single-phase seven (7) level modulator comprising seven (7) cells connected in series with capacitive storage element on DC-link side as depicted in FIG. 1. The seven (7) level modulator is operated with active electrodes installed in the diverters of the colliding beam FRC based reactor. The active electrodes are in touch with the plasma and the PSU provides the current of up to 5 kA to the plasma with an output voltage of up to 5 kV. The plasma parameters during a plasma discharge significantly and rapidly change and thus the required bias voltage has to be regulated and stabilized at the desired reference value.

Figure 11A:
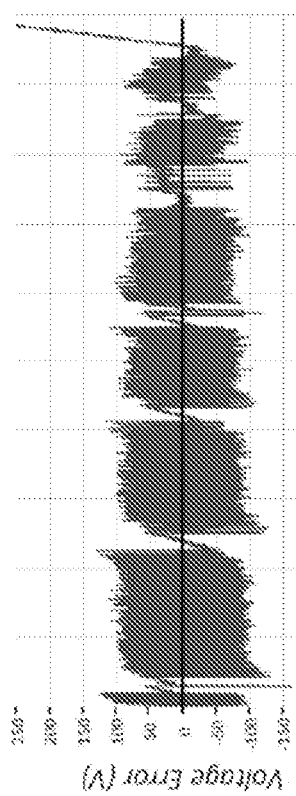
FIGS. 11A, 11B, and 11C illustrate exemplary experimental results of operation of an exemplary seven (7) level voltage modulator operated with active electrodes of diverts of an FRC reactor and according to embodiments of the present disclosure.
Figure 11B:
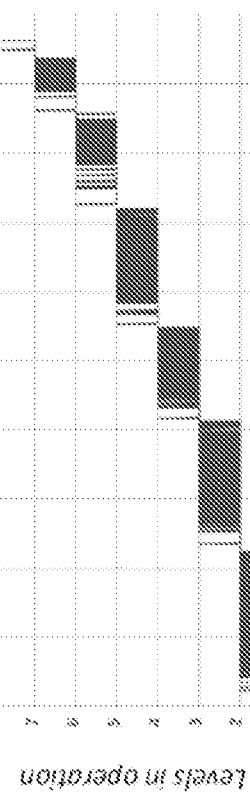
Figure 11C:
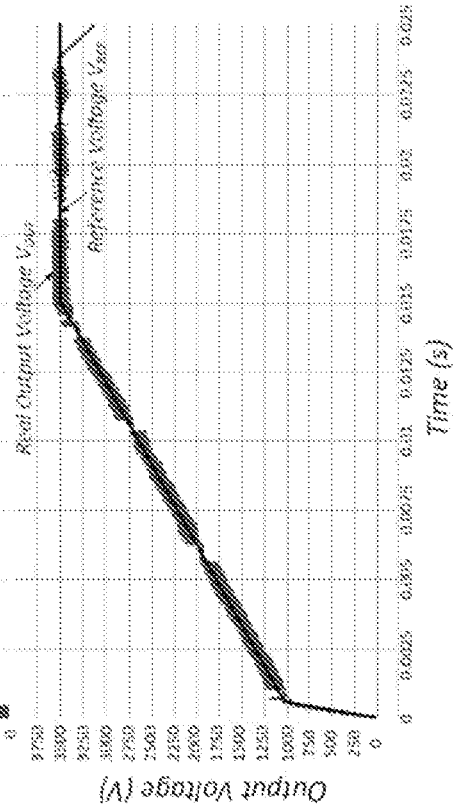
Figure 12A:
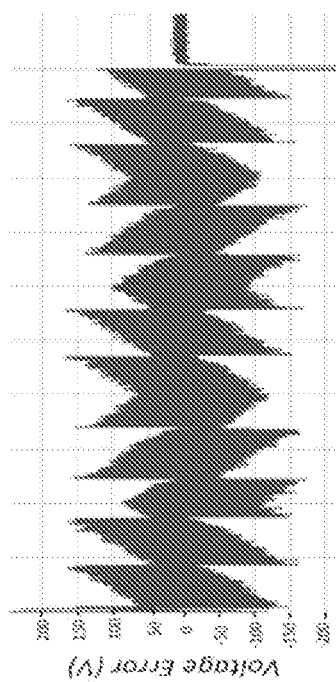
FIGS. 12A, 12B, and 12C illustrate exemplary experimental results of operation of an exemplary seven (7) level voltage modulator operated with active electrodes of diverts of an FRC reactor and according to embodiments of the present disclosure.
Figure 12B:
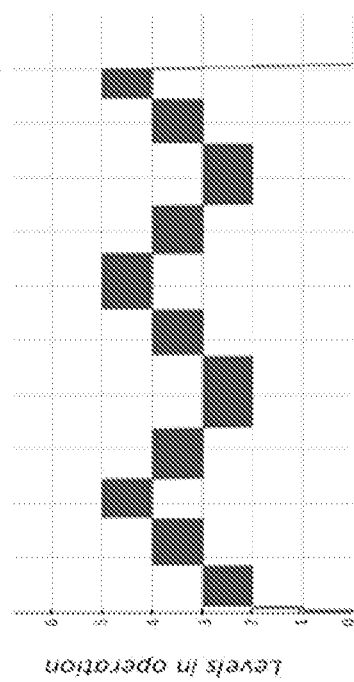
Figure 12C:
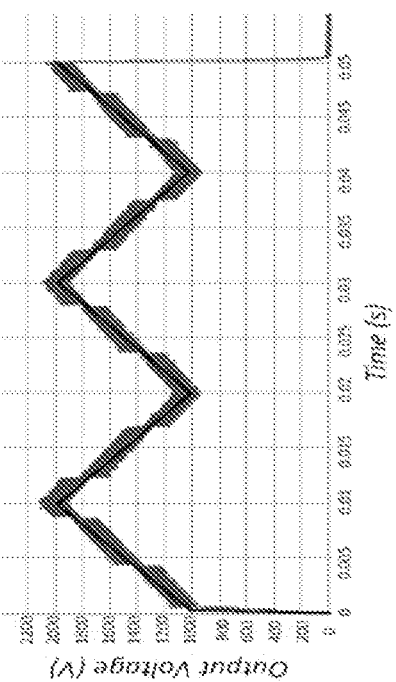

The reference voltage $V_{REF}$ and real output voltage of the PSU $V_{OUT}$ are shown as functions of time in FIG. 11B. As can be seen, $V_{OUT}$ is regulated and stabilized around $V_{REF}$ with a voltage control error signal presented in FIG. 11A while not exceeding a preset value of +/−100 A. The required number of levels of the output voltage calculated by the Voltage Level Estimator block (204, see FIG. 2) is shown in FIG. 11B. As the capacitor banks in the DC-links of power cells are discharging it requires more levels of output voltage to be set up to maintain a constant output voltage of 3.5 kV and the proposed methodology calculates it accordingly. At the end of the pulse all capacitor banks are discharged to the voltage, at which a setting of all 8 levels is not enough regulate $V_{OUT}$, which causes an increase of output voltage error signal.

FIG. 12 shows the experimental results of operation of the same Active Electrode PSU with a triangle reference voltage $V_{REF}$, demonstrating a high dynamic capability of proposed voltage hysteresis controller to regulate and stabilize a voltage with a fast changing dV/dt value.

Embodiments of the present disclosure are directed to a multi-level cascaded voltage modulator connectable to a load. In embodiments, the multi-level cascaded voltage modulator comprises a plurality of power cells connected in series, wherein each cell of the plurality of cells comprises a of bidirectional switch and a storage element, and a control system coupled to the plurality of cells and having a multi-level hysteresis voltage controller. In embodiments, the control system is configured to cause the plurality of cells to output N levels of voltage on the load, wherein N is a positive integer corresponding to the number of power cells of the plurality of power cells.

In embodiments, each cell of the plurality of cells includes a secondary winding isolation transformer, a three-phase diode bridge coupled to the transformer and the storage element, and a diode.

In embodiments, the bidirectional switch is one of an IGBT or a MOSFET.

In embodiments, each cell of the plurality of cells further comprises an LCR filter at its output.

In embodiments, the modulator further comprises a CR filter at the output of the plurality of cells.

In embodiments, the control system is further configured to cause the transfer of electrical power from the energy storage elements of the power cells to the load.

In embodiments, the control system is further configured to balance voltages on the storage elements.

In embodiments, the storage element is a capacitor.

In embodiments, the control system including one or more processors coupled to a non-transitory memory comprising a plurality of instructions that when executed causes the one or more processors to control a level of voltage on the load.

In embodiments, the plurality of instructions when executed causes the one or more processors to control an output voltage level of the modulator as a function of the level of voltage on the load, a reference voltage and a voltage error equal to the difference between the level of voltage on the load and the reference voltage.

In embodiments, the plurality of instructions when executed causes the one or more processors to subtract from a reference voltage signal $V_{REF}$ a real feedback voltage signal $V_{REAL}$ received from a voltage sensor, produce, by a voltage level estimator, an estimated voltage level signal, Levels, using a high boundary (HB) threshold of a hysteresis block, a low boundary (LB) threshold of the hysteresis block, and the voltage difference signal $\Delta V$, and generate, by a switching pattern generator, a plurality of switching signals based on the estimated voltage level, Levels, and a state of the hysteresis block.

In embodiments, to subtract from a reference voltage signal $V_{REF}$ a real feedback voltage signal $V_{REAL}$, the plurality of instructions when executed causes the one or more processors to feed the real feedback voltage signal $V_{REAL}$ to a low-pass filter input, feed a low-pass filter output signal to a negative input of a first summation block, feed the reference voltage signal $V_{REF}$ to a positive input of the first summation block, and produce a voltage difference signal $\Delta V$ at an output of the first summation block.

In embodiments, when $\Delta V$ reaches the high boundary (HB) threshold of the hysteresis block, the plurality of instructions when executed causes the one or more processors to set the state of the hysteresis block to "1."

In embodiments, when $\Delta V$ reaches the low boundary (LB) threshold of the hysteresis block, the plurality of instructions when executed causes the one or more processors to set the state of the hysteresis block to "0."

In embodiments, to produce the estimated voltage level Levels, the plurality of instructions when executed causes the one or more processors to apply a clock signal to a clock generator, count, by a resettable counter, a number of clock signals generated by the clock generator when one or more of the following conditions is true: $\Delta V$ is lower than the low boundary (LB) threshold of the hysteresis block; or $\Delta V$ is higher than the high boundary (HB) threshold of the hysteresis block.

In embodiments, the plurality of instructions when executed causes the one or more processors further to, increment, by a free running counter, a free running counter output signal, apply the free running counter output signal to a second summation block, and decrement a number of Levels at an output of the voltage level estimator when both of the following cases are true at the same time: the signal $\Delta V$ is lower than the low boundary hysteresis threshold LB; and the value of an output counting signal of the resettable counter is higher than a preset value of a time constant.

In embodiments, when both the signal $\Delta V$ is lower than the low boundary hysteresis threshold LB and the value of the output counting signal of the resettable counter is higher than the preset value of a time constant, the plurality of instructions when executed causes the one or more processors to set the output of a logic element of a level decrement circuit to True, detect the output of the logic element with a rising edge detector, and increment the free running counter, and thereby decrement an output level at a summation block.

In embodiments, the multi-level hysteresis voltage controller comprises a low pass filter having a low-pass filter input and a low-pass filter output, a first summation block having a positive input and a negative input, a hysteresis block having a high boundary (HB) threshold and a low boundary (LB) threshold, a voltage level estimator having a plurality of voltage level estimator inputs and a voltage level output signal Levels, and a switching pattern generator having a plurality of switching pattern generator inputs and a plurality of switching pattern generator outputs.

In embodiments, the switching pattern generator comprises a comparator block, a resettable counter, a first multiplexer having a first plurality of input signals, and a second multiplexer having a second plurality of input signals.

In embodiments, each input signal of the second plurality of input signals represents an array of switching states each corresponding to a one of plurality of output levels for a voltage modulator.

In embodiments, the plurality of output levels ranges from 0VDC when all switching signals are false to a maximum output voltage when all switching signals are true.

In embodiments, the voltage level estimator comprises, a clock counting circuit, a level decrement circuit, an enable and reset circuit for the resettable counter, and a second summation block.

In embodiments, the clock counting circuit comprises a clock generator, a logic switch, and a resettable counter.

In embodiments, the level decrement circuit comprises a first logic element, a rising edge detector, and a free running counter.

In embodiments, the enable and reset circuit comprises a second logic element, a rising edge detector and a third logic element.

In embodiments, the first logic element is an AND gate, the second logic element is an XOR gate, and the third logic element is an OR gate.

In embodiments, when $\Delta V$ reaches the high boundary (HB) threshold of the hysteresis block, the state of the hysteresis block is set to "1."

In embodiments, when $\Delta V$ reaches the low boundary (LB) threshold of the hysteresis block, the state of the hysteresis block is set to "0."

In embodiments, the load is in a power electronic circuit in one or more of an electrode biasing power supply for a Tokamak plasma reactor, an electrode biasing power supply for a FRC plasma reactor, a power supply for a neutral beam injector, a magnetron modulator, a klystron modulator, an E-gun modulator, a high power X-ray power supply, a mediumwave transmitter, a longwave transmitter, and a shortwave solid-state transmitter.

Embodiments of the present disclosure are directed to a multi-level hysteresis voltage controller connectable to a load. In embodiments, the multi-level hysteresis voltage controller (MHVC) comprises a low pass filter having a low-pass filter input and a low-pass filter output, a first summation block having a positive input and a negative input, a hysteresis block having a high boundary (HB) threshold and a low boundary (LB) threshold, a voltage level estimator having a plurality of voltage level estimator inputs and a voltage level output signal Levels; and a switching pattern generator having a plurality of switching pattern generator inputs and a plurality of switching pattern generator outputs.

In embodiments, the switching pattern generator comprises a comparator block, a resettable counter, a first multiplexer having a first plurality of input signals, and a second multiplexer having a second plurality of input signals.

In embodiments, each input signal of the second plurality of input signals represents an array of switching states each corresponding to a one of plurality of output levels for a voltage modulator.

In embodiments, the plurality of output levels ranges from 0VDC when all switching signals are false to a maximum output voltage when all switching signals are true.

In embodiments, the voltage level estimator comprises a clock counting circuit, a level decrement circuit comprising, an enable and reset circuit for the resettable counter, and a second summation block.

In embodiments, the clock counting circuit comprises a clock generator, a logic switch, and a resettable counter.

In embodiments, the level decrement circuit comprises a first logic element, a rising edge detector, and a free running counter.

In embodiments, the enable and reset circuit comprises a second logic element, a rising edge detector and a third logic element.

In embodiments, the first logic element is an AND gate, the logic second element is an XOR gate, and the third logic element is an OR gate.

In embodiments, when $\Delta V$ reaches the high boundary (HB) threshold of the hysteresis block, the state of the hysteresis block is set to "1."

In embodiments, when $\Delta V$ reaches the low boundary (LB) threshold of the hysteresis block, the state of the hysteresis block is set to "0."

In embodiments, the load is in a power electronic circuit in one or more of an electrode biasing power supply for a Tokamak plasma reactor, an electrode biasing power supply for a FRC plasma reactor, a power supply for a neutral beam injector, a magnetron modulator, a klystron modulator, an E-gun modulator, a high power X-ray power supply, a mediumwave transmitter, a longwave transmitter, and a shortwave solid-state transmitter.

Embodiments of the present disclosure are directed to a method of controlling a voltage supplied to a load using a multi-level hysteresis voltage controller. In embodiments, the method comprises receiving a real feedback voltage signal $V_{REAL}$ from a voltage sensor. In embodiments, the method further comprises subtracting the real feedback voltage signal $V_{REAL}$ from a reference voltage signal $V_{REF}$ by: feeding the real feedback voltage signal $V_{REAL}$ to a low-pass filter input, feeding a low-pass filter output signal to a negative input of a first summation block, feeding the reference voltage signal $V_{REF}$ to a positive input of the summation block, and producing a voltage difference signal $\Delta V$ at an output of the first summation block.

In embodiments, the method further comprises producing, by a voltage level estimator, an estimated voltage level signal, Levels, using a high boundary (HB) threshold of a hysteresis block, a low boundary (LB) threshold of the hysteresis block, and the voltage difference signal $\Delta V$. In embodiments, the method further comprises generating, by a switching pattern generator, a plurality of switching signals based on the estimated voltage level, Levels, and a state of the hysteresis block.

In embodiments, when $\Delta V$ reaches the high boundary (HB) threshold of the hysteresis block, the state of the hysteresis block is set to "1."

In embodiments, when $\Delta V$ reaches the low boundary (LB) threshold of the hysteresis block, the state of the hysteresis block is set to "0."

In embodiments, the voltage level estimator produces the estimated voltage level Levels by: applying a clock signal to a clock generator; counting, by a resettable counter, a number of clock signals generated by the clock generator when one or more of the following conditions is true: $\Delta V$ is lower than the low boundary (LB) threshold of the hysteresis block, or $\Delta V$ is higher than the high boundary (HB) threshold of the hysteresis block; incrementing, by a free running counter, a free running counter output signal; applying the free running counter output signal to a summation block; and decrementing a number of Levels at an output of the voltage level estimator when both of the following cases are true at the same time: the signal $\Delta V$ is lower than the low boundary hysteresis threshold LB, and the value of an output counting signal of the resettable counter is higher than a preset value of a time constant.

In embodiments, when both the signal $\Delta V$ is lower than the low boundary hysteresis threshold LB and the value of the output counting signal of the resettable counter is higher than the preset value of a time constant, a first logic element output of a level decrement circuit becomes True; a rising edge detector detects the first logic element output; and the free running counter is incremented, thereby decrementing an output level at a summation block.

The processors of the control systems and controllers of the present disclosure may be configured to perform the computations and analyses described in the present disclosure and may include or be communicatively coupled to one or more memories including non-transitory computer readable medium. It may include a processor-based or microprocessor-based system including systems using microcontrollers, reduced instruction set computers (RISC), application specific integrated circuits (ASICs), logic circuits, and any other circuit or processor capable of executing the functions described herein. The above examples are exemplary only, and are thus not intended to limit in any way the definition and/or meaning of the term "processor" or "computer."

Functions of the processor may be implemented using either software routines, hardware components, or combinations thereof. The hardware components may be implemented using a variety of technologies, including, for example, integrated circuits or discrete electronic components. The processor unit typically includes a readable/writeable memory storage device and typically also includes the hardware and/or software to write to and/or read the memory storage device.

The processors may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor may also include a storage device, which may be a hard disk drive or a removable storage drive such as, e.g., an optical disk drive and the like. The storage device may also be other similar means for loading computer programs or other instructions into the computer or processor.

The processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the processors as a processing machine to perform specific operations such as the methods and processes of the various embodiments of the subject matter described herein. The set of instructions may be in the form of a software program. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to user commands, or in response to results of previous processing, or in response to a request made by another processing machine.

As used herein, the terms "software" and "firmware" may be interchangeable, and include any computer program stored in memory for execution by a computer, including RAM memory, ROM memory, EEPROM memory, and non-volatile RAM (NVRAM) memory. The above memory types are exemplary only, and are thus not limiting as to the types of memory usable for storage of a computer program.

All features, elements, components, functions, and steps described with respect to any embodiment provided herein are intended to be freely combinable and substitutable with those from any other embodiment. If a certain feature, element, component, function, or step is described with respect to only one embodiment, then it should be understood that that feature, element, component, function, or step can be used with every other embodiment described herein unless explicitly stated otherwise. This paragraph therefore serves as antecedent basis and written support for the introduction of claims, at any time, that combine features, elements, components, functions, and steps from different embodiments, or that substitute features, elements, components, functions, and steps from one embodiment with those of another, even if the following description does not explicitly state, in a particular instance, that such combinations or substitutions are possible. Express recitation of every possible combination and substitution is overly burdensome, especially given that the permissibility of each and every such combination and substitution will be readily recognized by those of ordinary skill in the art upon reading this description.

In many instances entities are described herein as being coupled to other entities. It should be understood that the terms "coupled" and "connected" or any of their forms are used interchangeably herein and, in both cases, are generic to the direct coupling of two entities without any non-negligible e.g., parasitic intervening entities and the indirect coupling of two entities with one or more non-negligible intervening entities. Where entities are shown as being directly coupled together, or described as coupled together without description of any intervening entity, it should be understood that those entities can be indirectly coupled together as well unless the context clearly dictates otherwise.

While the embodiments are susceptible to various modifications and alternative forms, specific examples thereof have been shown in the drawings and are herein described in detail. It should be understood, however, that these embodiments are not to be limited to the particular form disclosed, but to the contrary, these embodiments are to cover all modifications, equivalents, and alternatives falling within the spirit of the disclosure. Furthermore, any features, functions, steps, or elements of the embodiments may be recited in or added to the claims, as well as negative limitations that define the inventive scope of the claims by features, functions, steps, or elements that are not within that scope.

What is claimed is:

1. A multi-level cascaded voltage modulator, comprising:
    a plurality of cells connected in series, wherein each cell comprises a switch and a storage element;
    a cell rotation value generator that receives, as input, a signal based on an output of a voltage hysteresis block and generates, in response to the signal, a cell rotation value;
    a switching signals generator that receives, as input, an input signal based on a voltage level signal and the cell rotation value, and in response, generates a set of switching signals, wherein each switching signal is respectively generated for a respective cell of the plurality of cells; and
    wherein the switching signals are respectively applied to the respective switches of the respective cells.

2. The multi-level cascade voltage modulator of claim 1, wherein:
    the plurality of cells comprise N cells;
    the switching signals generator can generate a plurality of different sets of switching signals, and each set of switching signals generated by the switching signals generator, when applied to the respective switches of the respective cells, cause from 0 to N of the cells to each output a positive DC voltage VDC; and
    the cell rotation value generated by the cell rotation value generator, when applied to the switching signals generator, specifies respective sets of switching signals for 1 to N−1 cells to each output the voltage VDC.

3. The multi-level cascaded voltage modulator of claim 2, wherein the cell rotation value generator further comprises:
    a first multiplexer switch that receives, as input, an output value from 1 to N and generates, in response to the output value, the cell rotation value.

4. The multi-level cascaded voltage modulator of claim 3, wherein the cell rotation value generator further comprises:
    a counter, wherein the counter generates the output value from 1 to N based on the signal that is based on the output of the voltage hysteresis block and a reset signal.

5. The multi-level cascaded voltage modulator of claim 4, wherein the cell rotation value generator further comprises:
    a comparator, wherein the comparator compares an N value and the output value from 1 to N and, in response, generates the reset signal.

6. The multi-level cascaded voltage modulator of claim 2, wherein the switching signals generator further comprises:
    a second multiplexer switch that receives, as input, respective rotation block outputs of a plurality of rotation block generators and an output signal of a summation block, and in response, generates the set of switching signals.

7. The multi-level cascaded voltage modulator of claim 6, wherein the switching signals generator further comprises:
    the summation block, wherein the summation blocks receives the voltage level signal and a static value, and in response, generates the output signal of the summation block; and
    the plurality of rotation blocks, wherein each rotation block generates a respective rotation block output.

8. The multi-level cascaded voltage modulator of claim 7, wherein each rotation block of the plurality of rotation blocks receives the cell rotation value as input and in response, generates a respective set of switching signals based on the cell rotation value.

9. The multi-level cascaded voltage modulator of claim 8, wherein each cell rotation value specifies a number of active cells and a position of the active cells, wherein each active cell outputs the voltage VDC.

10. A method performed in a voltage modulator, comprising:
- receiving a hysteresis state signal that is generated based on a voltage sensed on a load;
- generating, in response to the hysteresis state signal, a cell rotation value;
- receiving an input signal based on a voltage level signal;
- generating, in response to the voltage level signal and the cell rotation value, a set of switching signals, wherein each switching signal is respectively generated for a respective cell of a plurality of cells connected in series, wherein each cell comprises a switch and a storage element; and
- wherein the switching signals are respectively applied to the respective switches of the respective cells to generate an output voltage for the load.

11. The method of claim 10, wherein:
- the plurality of cells comprise N cells;
- generating, in response to the voltage level signal and the cell rotation value, a set of switching signals comprises generating one of a plurality sets of switching signals, wherein each set of set of switching signals, when applied to the respective switches of the respective cells, cause from 0 to N of the cells to each output a positive DC voltage VDC; and
- the cell rotation value specifies respective sets of switching signals for 1 to N−1 cells to each output the voltage VDC.

12. The method of claim 11, wherein each cell rotation value specifies a number of active cells and a position of the active cells, wherein each active cell outputs the voltage VDC.

13. The method of claim 11, wherein generating, in response to the voltage level signal and the cell rotation value, a set of switching signals, comprises:
- selecting, by the cell rotation value, a plurality of sets of switching signals, wherein each set of switching signals defines a specific number of up to N−1 cells to output the voltage VDC; and
- selecting, based on the voltage level signal, one set of the plurality of sets of switching signals.

* * * * *

UNITED STATES PATENT AND TRADEMARK OFFICE
CERTIFICATE OF CORRECTION

| | |
|---|---|
| PATENT NO. | : 11,881,761 B2 |
| APPLICATION NO. | : 18/297706 |
| DATED | : January 23, 2024 |
| INVENTOR(S) | : Mikhail Slepchenkov |

It is certified that error appears in the above-identified patent and that said Letters Patent is hereby corrected as shown below:

In the Specification

Column 1, Line 14, please delete "PCT/US18/38089" and insert therefor -- PCT/US2018/038089 --;

In the Claims

Column 16, Line 13, Claim 2, please delete "cascade" and insert therefor -- cascaded --; and Column 17, Line 21, Claim 11, after "plurality" please insert -- of --.

Signed and Sealed this
Fifth Day of March, 2024

Katherine Kelly Vidal
*Director of the United States Patent and Trademark Office*